(12) United States Patent
Sawada et al.

(10) Patent No.: US 8,384,187 B2
(45) Date of Patent: Feb. 26, 2013

(54) SEMICONDUCTOR DEVICE WITH SHALLOW TRENCH ISOLATION

(75) Inventors: Mahito Sawada, Tokyo (JP); Tatsunori Kaneoka, Tokyo (JP); Katsuyuki Horita, Tokyo (JP)

(73) Assignee: Renesas Electronics Corporation, Tokyo (JP)

(*) Notice: Subject to any disclaimer, the term of this patent is extended or adjusted under 35 U.S.C. 154(b) by 242 days.

(21) Appl. No.: 12/765,571

(22) Filed: Apr. 22, 2010

(65) Prior Publication Data

US 2010/0283108 A1    Nov. 11, 2010

(30) Foreign Application Priority Data

May 8, 2009   (JP) .................................. 2009-113844

(51) Int. Cl.
*H01L 21/762* (2006.01)
(52) U.S. Cl. ........................ 257/506; 257/510
(58) Field of Classification Search .................. 257/506, 257/510
See application file for complete search history.

(56) References Cited

U.S. PATENT DOCUMENTS

| | | | |
|---|---|---|---|
| 6,693,008 B1 | 2/2004 | Sato et al. | |
| 6,869,860 B2* | 3/2005 | Belyansky et al. | 438/435 |
| 7,052,971 B2 | 5/2006 | Nishiyama et al. | |
| 7,199,022 B2 | 4/2007 | Yasui et al. | |
| 7,416,987 B2 | 8/2008 | Hieda et al. | |
| 7,682,927 B2* | 3/2010 | Hoshi et al. | 438/424 |
| 7,811,935 B2* | 10/2010 | Sandhu | 438/672 |
| 2004/0248375 A1* | 12/2004 | McNeil et al. | 438/435 |
| 2006/0151855 A1 | 7/2006 | Kiyotoshi et al. | |
| 2006/0228866 A1* | 10/2006 | Ryan et al. | 438/435 |
| 2006/0246684 A1 | 11/2006 | Hoshi et al. | |
| 2008/0003775 A1 | 1/2008 | Yamada et al. | |

FOREIGN PATENT DOCUMENTS

| | | |
|---|---|---|
| JP | 2000-114362 | 4/2000 |
| JP | 2000-183150 | 6/2000 |
| JP | 2001-203263 | 7/2001 |
| JP | 2001-244328 | 9/2001 |
| JP | 2003-031650 | 1/2003 |
| JP | 2004-311487 | 11/2004 |
| JP | 2005-166700 | 6/2005 |
| JP | 2006-156471 | 6/2006 |
| JP | 2007-142311 | 6/2007 |
| JP | 2007-281300 | 10/2007 |
| JP | 2007-335807 | 12/2007 |

* cited by examiner

*Primary Examiner* — Eugene Lee
(74) *Attorney, Agent, or Firm* — McDermott Will & Emery LLP

(57) ABSTRACT

To provide a semiconductor device provided with an element isolation structure capable of hindering an adverse effect on electric characteristics of a semiconductor element, and a method of manufacturing the same. The thickness of a first silicon oxide film left in a shallow trench isolation having a relatively narrow width is thinner than the first silicon oxide film left in a shallow trench isolation having a relatively wide width. A second silicon oxide film (an upper layer) having a relatively high compressive stress by an HDP-CVD method is more thickly laminated over the first silicon oxide film in a lower layer by a thinned thickness of the first silicon oxide film. The compressive stress of an element isolation oxide film finally formed in a shallow trench isolation having a relatively narrow width is more enhanced.

8 Claims, 29 Drawing Sheets

SEMICONDUCTOR DEVICE WITH SHALLOW TRENCH ISOLATION

CROSS-REFERENCE TO RELATED APPLICATIONS

The disclosure of Japanese Patent Application No. 2009-113844 filed on May 8, 2009 including the specification, drawings and abstract is incorporated herein by reference in its entirety.

BACKGROUND OF THE INVENTION

The present invention relates to a semiconductor device and method of manufacturing the same, particularly, to a semiconductor device provided with an element isolation structure having shallow trench isolations with different widths and a method of manufacturing the same.

In order to electrically insulate respective elements formed over a semiconductor substrate, a shallow trench isolation (STI) for element isolation is formed in the semiconductor substrate, and an insulating film such as an oxide film is embedded into the gap for the shallow trench isolation. In the process of embedding the insulating film into the gap for the shallow trench isolation, a technique of embedding the insulating film into a gap for a shallow trench isolation having a high aspect ratio without generating a void is demanded, along with the miniaturization and density growth of patterns.

Until now, as a method of embedding an insulating film into the gap for the shallow trench isolation, a high density plasma chemical vapor deposition method (hereinafter, denoted as an "HDP-CVD method") has been employed. However, it has become difficult to embed an insulating film into a gap for a shallow trench isolation having a high aspect ratio without generating a void or seam.

Consequently, a technique is employed, in which a shallow trench isolation having a high aspect ratio is embedded by a sub-atmospheric chemical vapor deposition method (hereinafter, denoted as an "SA-CVD method") using $O_3$-TEOS (Tetra Ethyl Ortho Silicate), or a spin on dielectric method (hereinafter, denoted as an "SOD method") using polysilazane.

Moreover, as a method of embedding a silicon oxide film into a gap for a shallow trench isolation having a high aspect ratio without causing deterioration of electrical characteristics (such as deterioration of an isolation withstand voltage) and without generating a void, a technique combining the SOD method and the HDP-CVD method is proposed.

For example, Japanese Patent Laid-Open No. 2003-031650 (Patent Document 1) proposes a technique of embedding the shallow trench isolation by embedding a polysilazane film by the SOD method into the gap for the shallow trench isolation, then subjecting the polysilazane film to etch back, and forming an oxide film over the polysilazane by the HDP-CVD method. Japanese Patent Laid-Open No. 2000-183150 (Patent Document 2) proposes a technique in which the etch back of the polysilazane film embedded into the gap for the shallow trench isolation by the SOD method is performed by $O_2$ plasma.

Japanese Patent Laid-Open No. 2000-114362 (Patent Document 3) proposes a technique in which a CVD film with a low etching rate is formed over a polysilazane film embedded into the gap for the shallow trench isolation in order to eliminate a hollow of the shallow trench isolation caused by a high wet etching rate of the polysilazane film embedded into the gap for the shallow trench isolation by the SOD method. Japanese Patent Laid-Open No. 2007-142311 (Patent Document 4) proposes a technique in which the shallow trench isolation is embedded by embedding a silicon-rich oxide film into the bottom portion of the gap for the shallow trench isolation by the SOD method using polysilazane and, over it, forming an oxide film by the HDP-CVD method.

SUMMARY OF THE INVENTION

However, there are problems below for conventional semiconductor devices. An oxide film formed by the SA-CVD method using $O_3$-TEOS or the SOD method has a high wet etching rate as compared with an oxide film formed by the HDP-CVD method. Consequently, in order to densify an oxide film to be embedded into the gap for the shallow trench isolation to lower the wet etching rate, generally, the oxide film is subjected to an annealing treatment. An oxide film formed using the SA-CVD method or the SOD method has a larger contraction percentage of the film thickness when it is subjected to the annealing, as compared with the contraction percentage when an oxide film formed using the HDP-CVD method is subjected to the annealing treatment.

In the case of an oxide film having a comparatively large contraction percentage of film thickness, the level (degree) that the oxide film is densified by the annealing treatment changes according to the width of the shallow trench isolation, and an oxide film embedded into a gap for a shallow trench isolation having a narrower width is more hardly densified. Consequently, a narrower width of the shallow trench isolation results in a higher wet etching rate after the annealing for an oxide film embedded into the gap for the shallow trench isolation, and, when the oxide film embedded into the gap for the shallow trench isolation is finally formed as an element isolation oxide film, the height of the element isolation oxide film from the semiconductor substrate surface varies depending on the width of the shallow trench isolation.

The variation of the height of the element isolation oxide film depending on the width of the shallow trench isolation causes the variation of the gate dimension of MOS transistors formed in element formation regions surrounded by the shallow trench isolation, and the increase in the variation of electrical characteristics of the MOS transistors. Moreover, different degree of denseness of the oxide film depending on the width of the shallow trench isolation leads to different stress applied on element formation regions surrounded by the shallow trench isolation. Consequently, even in the case of MOS transistors having the same size, difference in electrical characteristics of the MOS transistors occurs depending on the width of the shallow trench isolation adjacent to the element formation region.

For example, in the case of an n-channel MOS transistor, ON current tends to become small when compressive stress acts on the element formation region. On the other hand, a wide width of the shallow trench isolation tends to give high compressive stress, and a narrow width of the shallow trench isolation tends to give low compressive stress. Consequently, the ON current tends to lower in MOS transistors formed in the element formation region adjacent to the shallow trench isolation having a wide width, and the ON current tends to rise in MOS transistors formed in the element formation region adjacent to the shallow trench isolation having a narrow width.

As described above, in conventional semiconductor devices, there is such problem that, depending on the width of the shallow trench isolation adjacent to the element formation region in which such semiconductor element as a MOS transistor is formed, electrical characteristics of the semiconductor element are varied.

The present invention was achieved in order to solve the above problem, and an object thereof is to provide a semiconductor device provided with an element isolation structure that hinders giving adverse effect on electrical characteristics of a semiconductor element, and another object is to provide a method of manufacturing such a semiconductor device.

A semiconductor device according to the present invention has a first shallow trench isolation, a second shallow trench isolation, and an element isolation insulating film. The first shallow trench isolation is formed extending from the surface of a semiconductor substrate to a prescribed depth with a first width, so as to sandwich a first region in the semiconductor substrate. The second shallow trench isolation is formed extending from the surface of the semiconductor substrate to a prescribed depth with a second width narrower than the first width, so as to sandwich a second region in the semiconductor substrate. The element isolation insulating film is formed so as to be embedded into the gap for the first shallow trench isolation and the gap for the second shallow trench isolation. The element isolation insulating film is provided with a first insulating film having a prescribed density, and a second insulating film having a density higher than that of the first insulating film. Into the gap for the first shallow trench isolation, the first insulating film is embedded. Into the gap for the second shallow trench isolation, the first insulating film and the second insulating film are embedded in such a mode that the second insulating film is laminated over the first insulating film.

A method of manufacturing a semiconductor device according to the present invention is provided with steps below. A mask material for forming a shallow trench isolation is formed over the principal surface of the semiconductor substrate. By subjecting the semiconductor substrate to etching using the mask material as a mask, the first shallow trench isolation having the first width and a prescribed depth is formed, so as to sandwich the first region in the semiconductor substrate, and the second shallow trench isolation having the second width narrower than the first width and a prescribed depth is formed, so as to sandwich the second region in the semiconductor substrate. The first insulating film is formed over the semiconductor substrate so as to be embedded into the gap for the first shallow trench isolation and the gap for the second shallow trench isolation. The first insulating film is subjected to an annealing treatment. The first insulating film is flattened to the surface of the mask material in such a mode as leaving the portion of the first insulating film lying in the first shallow trench isolation and the second shallow trench isolation. By subjecting the portion of the first insulating film left in each of the first shallow trench isolation and the second shallow trench isolation to a wet etching treatment, the position of the upper surface of the first insulating film left in the first shallow trench isolation is lowered, and the position of the upper surface of the first insulating film left in the second shallow trench isolation is lowered than the position of the upper surface of the first insulating film left in the first shallow trench isolation. The second insulating film having a density higher than that of the annealed first insulating film is formed over the semiconductor substrate so as to cover the portion of the first insulating film left in the first shallow trench isolation and the portion of the first insulating film left in the second shallow trench isolation. The height of the second insulating film is adjusted by subjecting the second insulating film to etching, in such a mode as not leaving the portion of the second insulating film lying in the first shallow trench isolation, and leaving the portion of the second insulating film lying in the second shallow trench isolation. The mask material is removed.

In the semiconductor device according to the present invention, into the gap for the first shallow trench isolation having the first width, the first insulating film is embedded, and into the gap for the second shallow trench isolation having the second width narrower than the first width, the first insulating film and the second insulating film are embedded in such a mode that the second insulating film having a density higher than that of the annealed first insulating film is laminated over the first insulating film. This reduces the difference between the compressive stress of the element isolation insulating film finally formed in the second shallow trench isolation having a relatively narrow width and the compressive stress of the element isolation insulating film finally formed in the first shallow trench isolation having a relatively wide width, to reduce the variation of the compressive stress acting on the first region sandwiched between the first shallow trench isolations and that acting on the second region sandwiched between the second shallow trench isolations. As the result, it is possible to reduce the variation of electrical characteristics of semiconductor elements each formed in the first region and the second region.

In the method of manufacturing the semiconductor device according to the present invention, only the first insulating film is formed in the first shallow trench isolation having the first width, and the first insulating film and the second insulating film are formed in the second shallow trench isolation having the second width narrower than the first width in such a mode that the second insulating film having a density higher than that of the annealed first insulating film is laminated over the first insulating film. This reduces the difference between the compressive stress of the first insulating film and the second insulating film finally formed in the second shallow trench isolation having a relatively narrow width, and the compressive stress of the first insulating film finally formed in the first shallow trench isolation having a relatively wide width, to reduce the variation of the compressive stress acting on the first region sandwiched between the first shallow trench isolations and that acting on the second region sandwiched between the second shallow trench isolations. As the result, it is possible to reduce the variation of electrical characteristics of semiconductor elements each formed in the first region and the second region.

DETAILED DESCRIPTION OF PREFERRED EMBODIMENTS

Example 1

Figure 1:
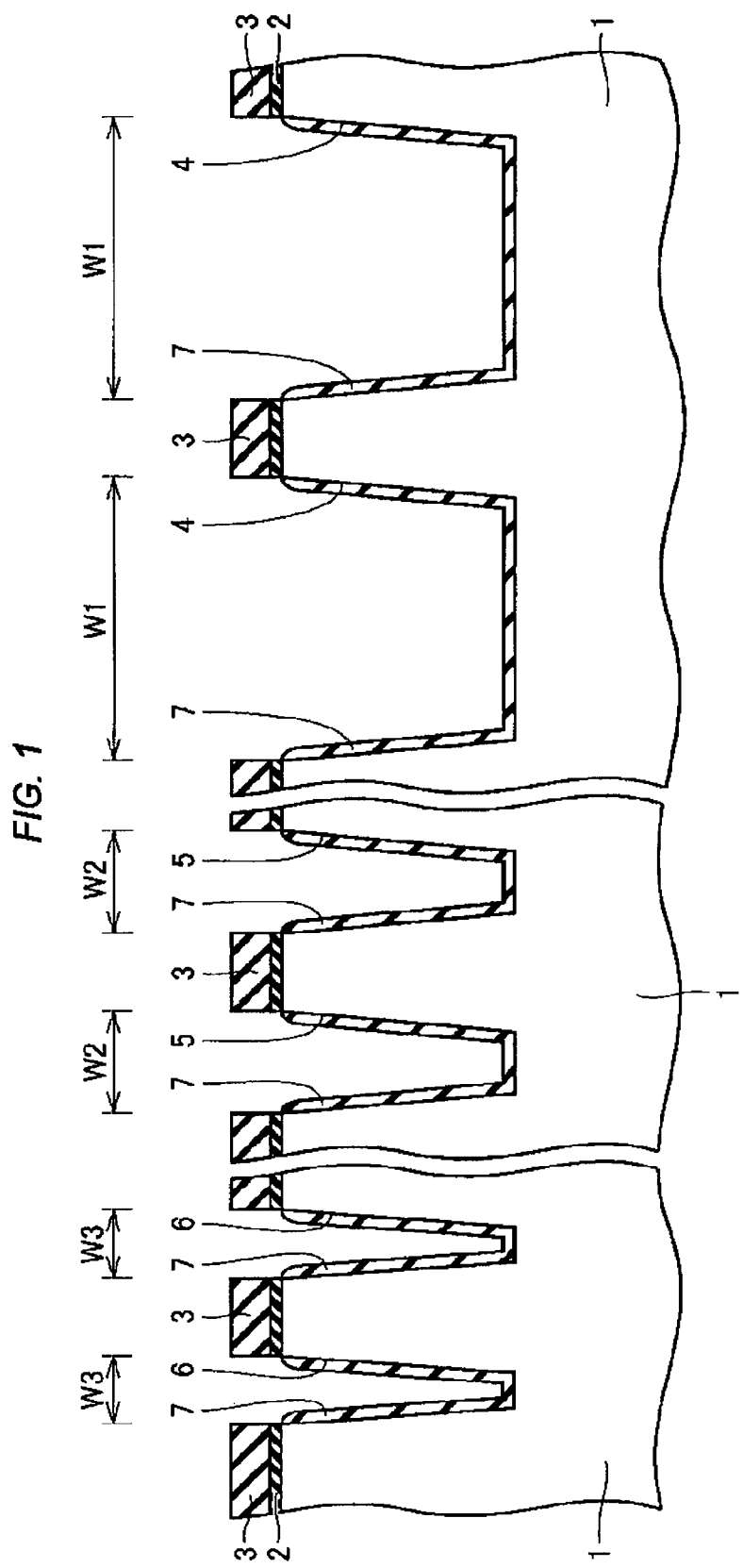
FIG. 1 is a cross-sectional view showing a process of a method of manufacturing a semiconductor device according to Example 1 of the present invention.

A semiconductor device and a method of manufacturing the same according to Example 1 of the present invention will be described. As shown in FIG. 1, firstly, a mask material for forming a shallow trench isolation is formed over the principal surface of a semiconductor substrate 1. As the mask material, a silicon oxide film 2 having a thickness of about 5 to 20 nm is formed over the principal surface of the semiconductor substrate 1, and, next, a silicon nitride film 3 having a thickness of about 50 to 200 nm is formed over the silicon oxide film 2.

Over the silicon nitride film 3, a resist pattern (not shown) is formed by providing an intended photolithographic treatment. Using the resist pattern as a mask, the silicon nitride film 3 and the silicon oxide film 2 are subjected to a dry etching treatment, to form a mask material constituted from the silicon nitride film 3 and the silicon oxide film 2 for forming the shallow trench isolation.

While using the silicon nitride film 3 and the silicon oxide film 2 as a mask, the exposed surface of the semiconductor substrate 1 is subjected to a dry etching treatment to form shallow trench isolations 4, 5 and 6 having various widths and a depth of about 300 nm to 500 nm. Here, when the width of the shallow trench isolation 4 is denoted by W1, width W2 of the shallow trench isolation 5 is set to be narrower than the width W1, and width W3 of the shallow trench isolation 6 is set to be narrower than the width W2. Meanwhile, the shallow trench isolation may be formed by a continuous series of dry etching treatment with the mask material, after forming the resist pattern.

Here, for example, the width W2 of the shallow trench isolation 5 is set to be about 70 nm or less, and the width W3 of the shallow trench isolation 6 is set to be about 50 nm or less. Each of shallow trench isolations 4, 5 and 6 is formed so as to sandwich an intended region of the semiconductor substrate 1, in a mode of partitioning the element formation region wherein an intended element is formed. Next, over the side wall surface of shallow trench isolations 4, 5 and 6, a silicon oxide film 7 having a thickness of about 3 to 20 nm is formed. The silicon oxide film 7 is preferably subjected to a nitridation treatment. As described above, shallow trench isolations 4, 5 and 6 are formed.

Figure 2:
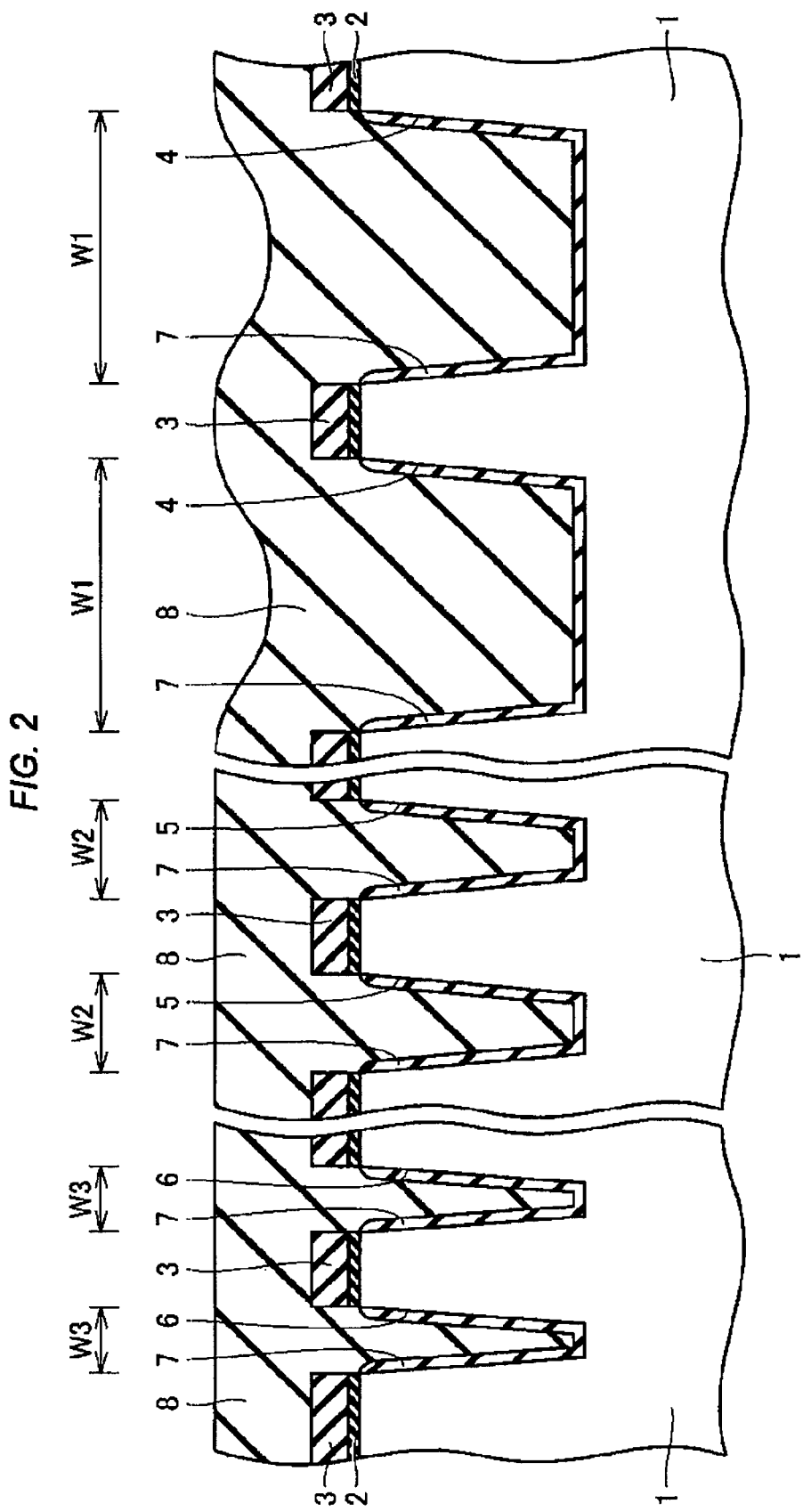
FIG. 2 is a cross-sectional view showing a process performed after the process shown in FIG. 1 in the same Example.

Next, a solution of polysilazane dissolved in dibutyl ether is prepared, which is coated by the SOD method over the semiconductor substrate 1 in such a mode that the solution fills up the shallow trench isolations 4, 5 and 6. Next, as shown in FIG. 2, by providing a baking treatment under a temperature of about 100 to 200° C. for about 1 to 5 minutes, the solvent (dibutyl ether) is removed and a polysilazane film 8 is embedded into the gap for the shallow trench isolations 4, 5 and 6.

Figure 3:
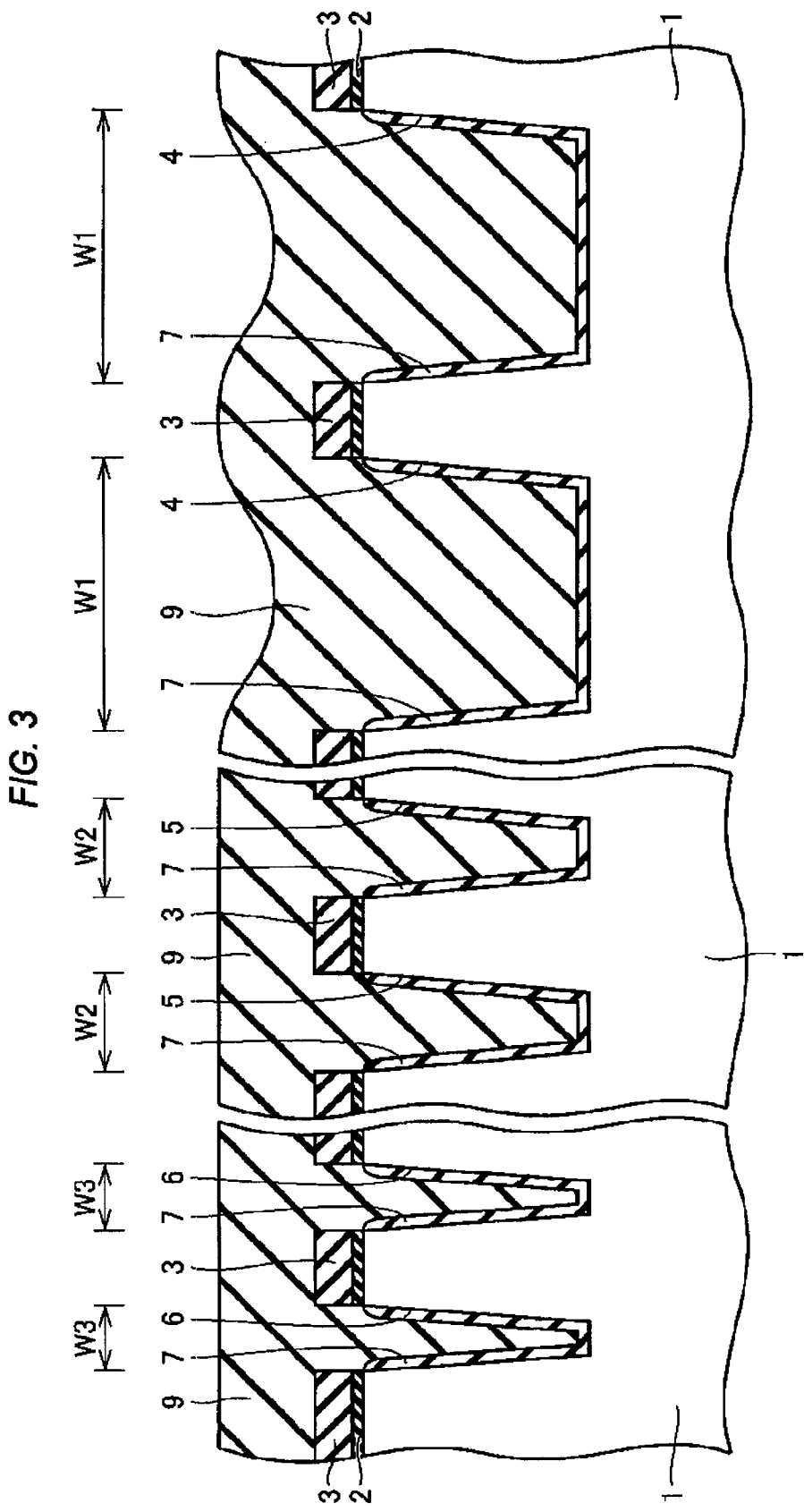
FIG. 3 is a cross-sectional view showing a process performed after the process shown in FIG. 2 in the same Example.

Next, as shown in FIG. 3, by providing a heat treatment in a water vapor atmosphere at a temperature of 300 to 900° C., the polysilazane film 8 changes into a silicon oxide film 9. By the heat treatment, a hydrolysis reaction shown below occurs.

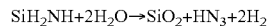

$$SiH_2NH + 2H_2O \rightarrow SiO_2 + HN_3 + 2H_2$$

The heat treatment in the water vapor atmosphere is preferably a heat treatment including two or more steps of varied heat treatment temperatures. Next, by providing a heat treatment in an atmosphere of such an inert gas as nitrogen ($N_2$) or argon (Ar) at a temperature of 700 to 1100° C. for about 10 to 120 minutes, the silicon oxide film 9 is densified.

At this time, as described later, the degree of the densification of the silicon oxide film 9 depends on the width of the shallow trench isolation, and, a narrower width of the shallow trench isolation makes the densification harder. Consequently, regarding the density of the silicon oxide film 9 lying inside the gap for shallow trench isolations 4, 5 and 6, the density of the portion of the silicon oxide film 9 lying inside the gap for the shallow trench isolation 6 is relatively lowest, and the density of the portion of the silicon oxide film 9 lying inside the gap for the shallow trench isolation 4 is relatively highest.

Figure 4:
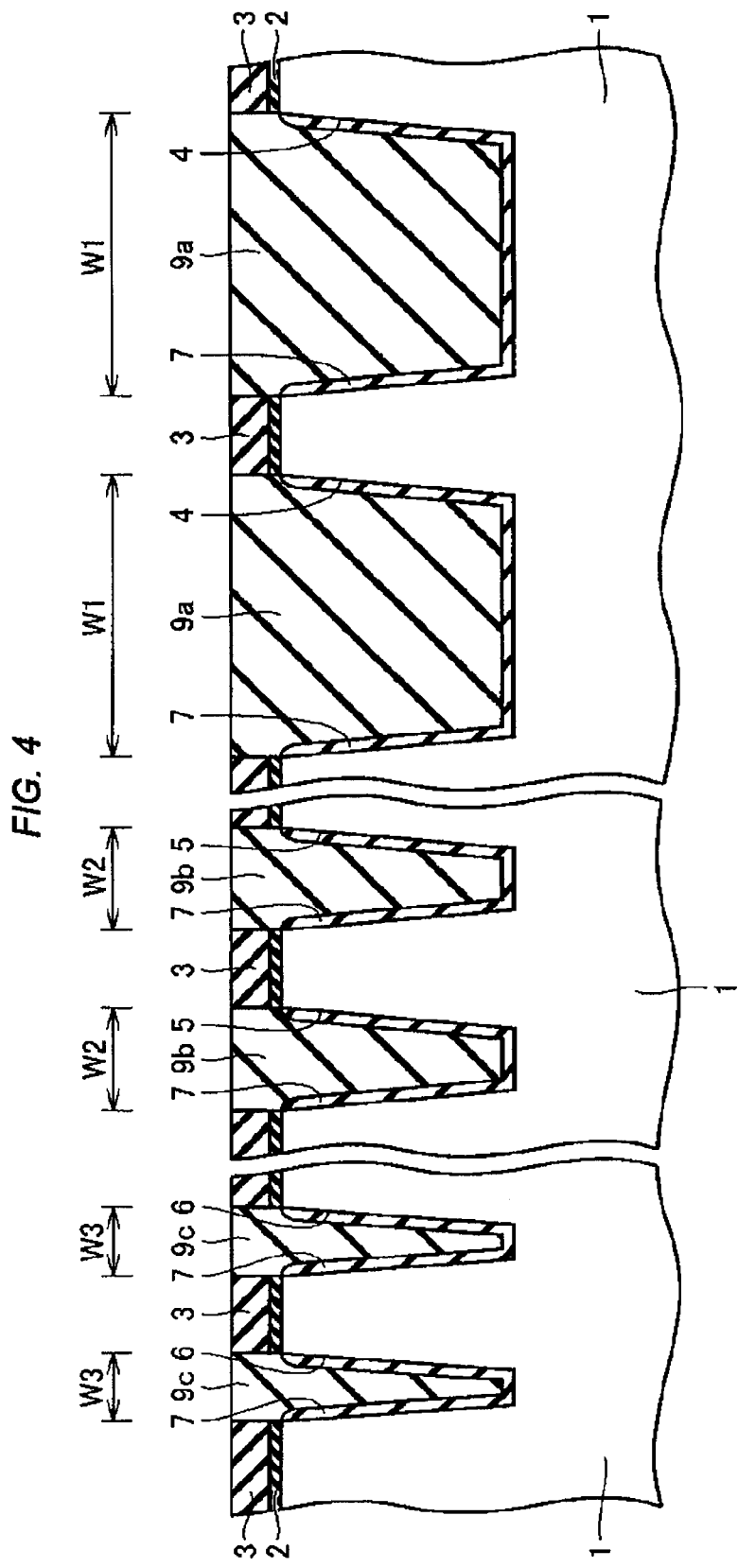
FIG. 4 is a cross-sectional view showing a process performed after the process shown in FIG. 3 in the same Example.

Next, as shown in FIG. 4, the portion of the silicon oxide film 9 lying upper than the upper surface of the silicon nitride film 3 is removed by a chemical mechanical polishing method (hereinafter, denoted by a "CMP method") using the silicon nitride film 3 as a stopper film. As described above, silicon oxide films 9a, 9b and 9c, respectively, are left inside shallow trench isolations 4, 5 and 6.

Figure 5:
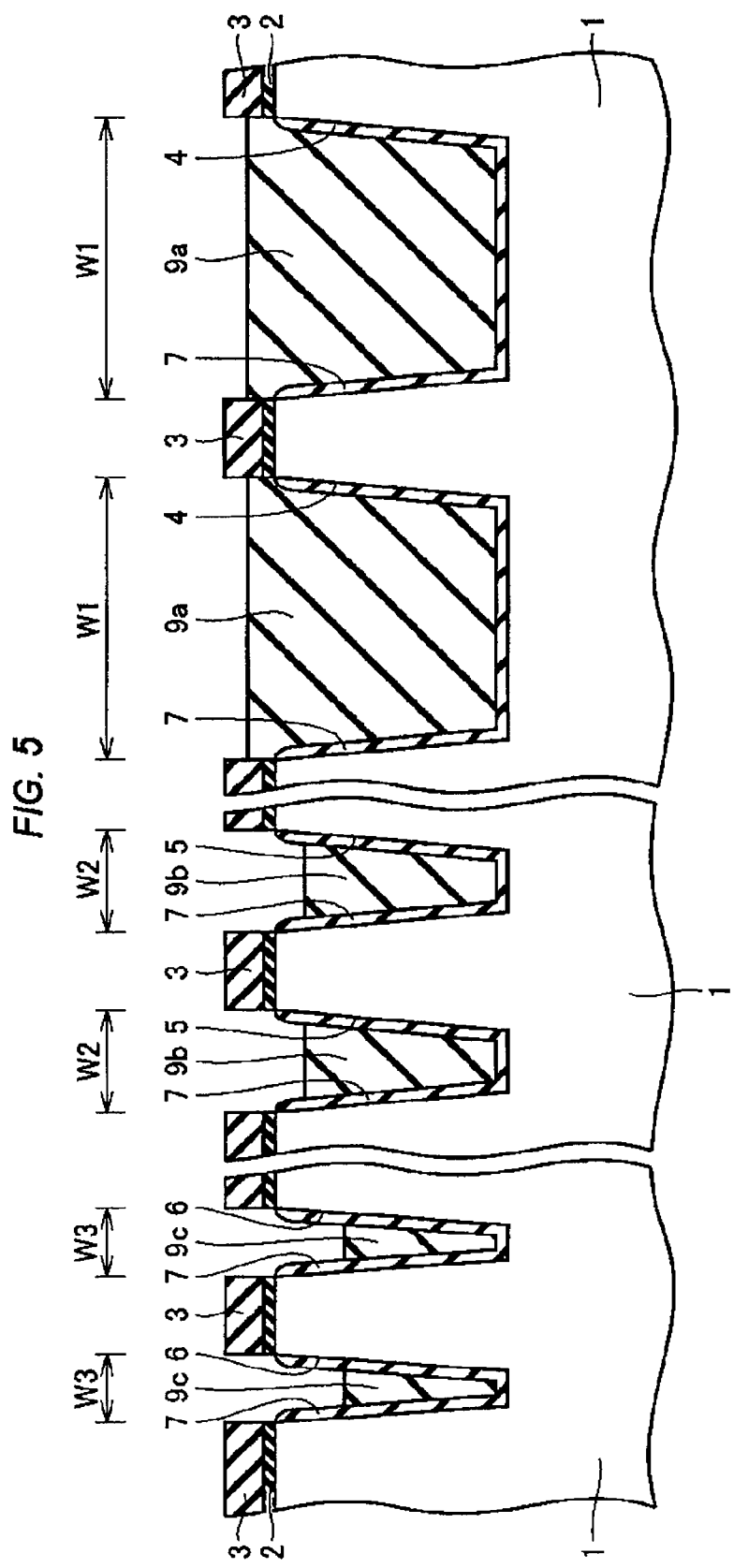
FIG. 5 is a cross-sectional view showing a process performed after the process shown in FIG. 4 in the same Example.

Next, as shown in FIG. 5, the silicon oxide film 9 is etched by providing a wet etching treatment using diluted hydrofluoric acid (diluted HF) or buffered hydrofluoric acid (BHF). At this time, as described above, depending on the densification degree of silicon oxide films 9a, 9b and 9c, the etching rate of the silicon oxide film 9c is highest and the etching rate of the silicon oxide film 9a is lowest among silicon oxide films 9a, 9b and 9c lying inside the gap for the shallow trench isolations 4, 5 and 6, respectively. This gives selective etching of silicon oxide films 9a, 9b and 9c lying inside the gap for the shallow trench isolations 4, 5 and 6, respectively, and the position of the upper surface of the silicon oxide film 9c becomes lowest and the position of the upper surface of the silicon oxide film 9a becomes highest.

Moreover, at this time, the wet etching amount of silicon oxide films 9a, 9b and 9c is determined so that the height of the silicon oxide film 9a lying in the gap for the shallow trench isolation 4 having a relatively wide trench width is upper than the boundary between the silicon nitride film 3 and the silicon oxide film 2, and is nearly higher than the height of the element isolation oxide film at the time point of the completion of the element isolation structure. Specifically, it is desirable that the height of the element isolation film at the time point of the completion is set to be higher than at least the surface of the silicon substrate 1, for the purpose of avoiding such a problem of an inverse narrow channel effect caused by the enclosure of the end of the element formation region by a gate electrode, or a problem caused by the stay of etching residues of a gate electrode material in a lowered portion (a fallen portion) that might occur if the surface of the element isolation film lies at a position lower than the surface of the silicon substrate 1.

Figure 6:
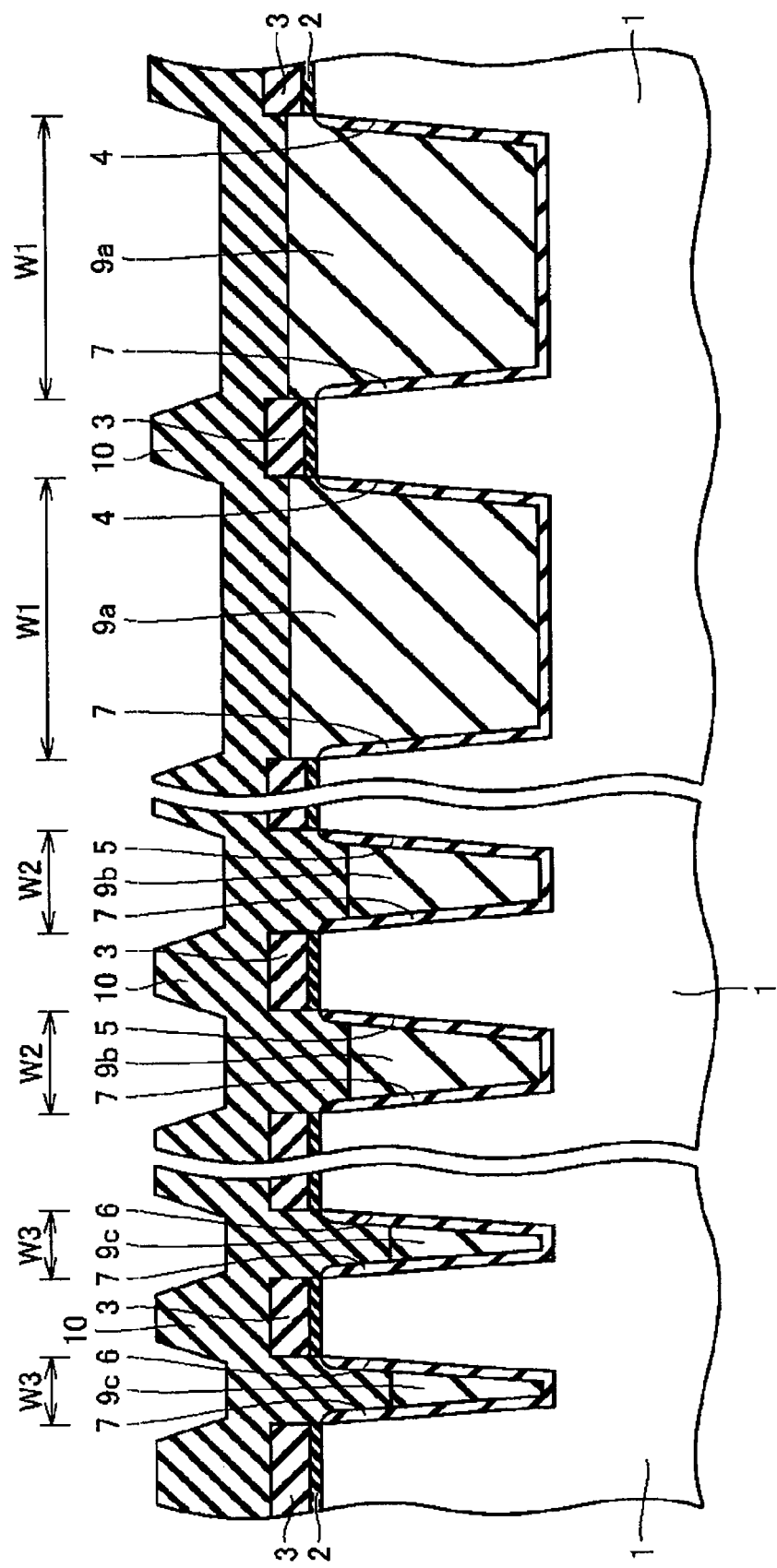
FIG. 6 is a cross-sectional view showing a process performed after the process shown in FIG. 5 in the same Example.

Next, as shown in FIG. 6, a silicon oxide film 10 is formed using the HDP-CVD method over the semiconductor substrate 1 so as to cover the silicon oxide films 9a, 9b and 9c. As the result of using the HDP-CVD method, the density of the silicon oxide film 10 becomes higher than the density of silicon oxide films 9a, 9b and 9c. Meanwhile, a heat treatment may be provided after the formation of the silicon oxide film 10.

Figure 7:
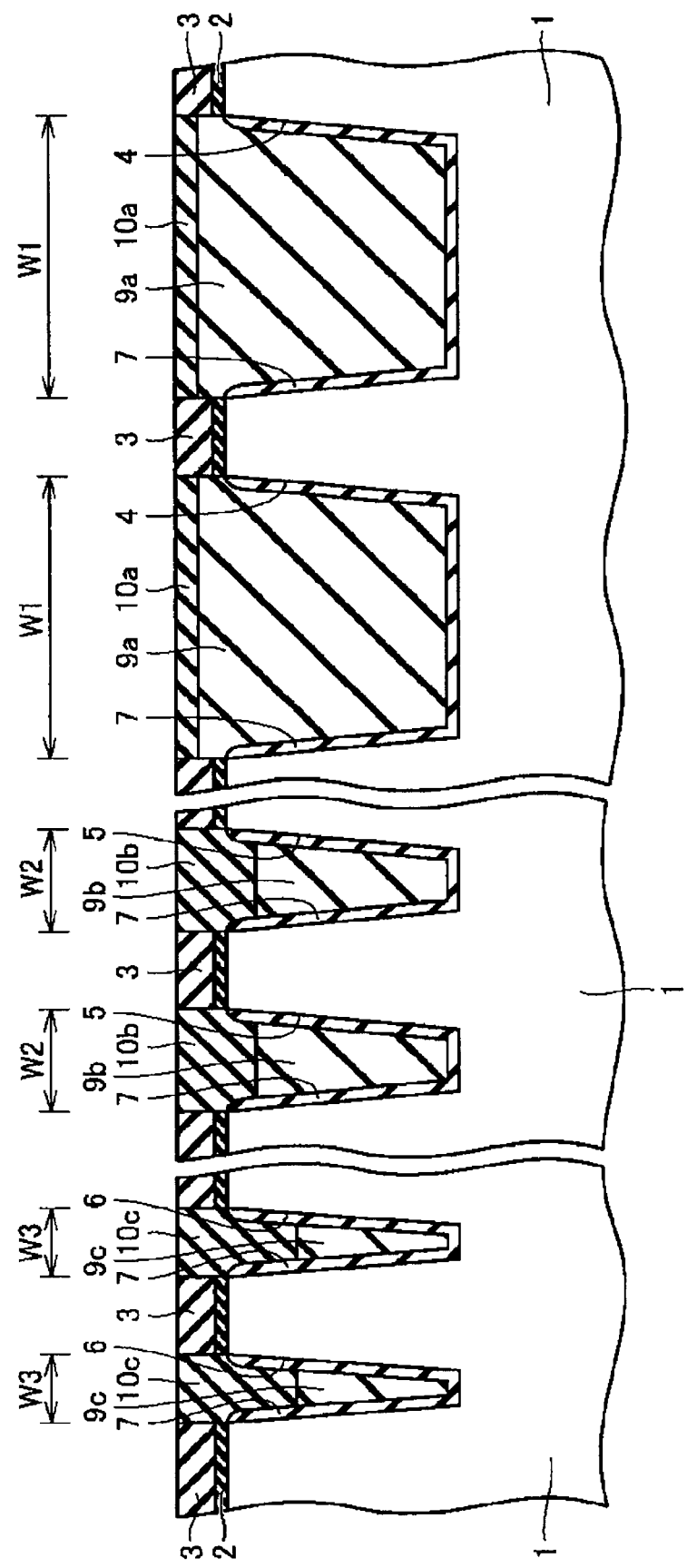
FIG. 7 is a cross-sectional view showing a process performed after the process shown in FIG. 6 in the same Example.

Next, as shown in FIG. 7, the portion of the silicon oxide film 10 lying upper than the upper surface of the silicon nitride film 3 is removed by the CMP method using the silicon nitride film 3 as a stopper film to flatten the surface of the semiconductor substrate 1. As described above, inside the shallow trench isolation 4, the silicon oxide film 10a is left over the silicon oxide film 9a, and, inside the shallow trench isolation 5, the silicon oxide film 10b is left over the silicon oxide film 9b. Moreover, inside the shallow trench isolation 6, the silicon oxide film 10c is left over the silicon oxide film 9c.

Figure 8:
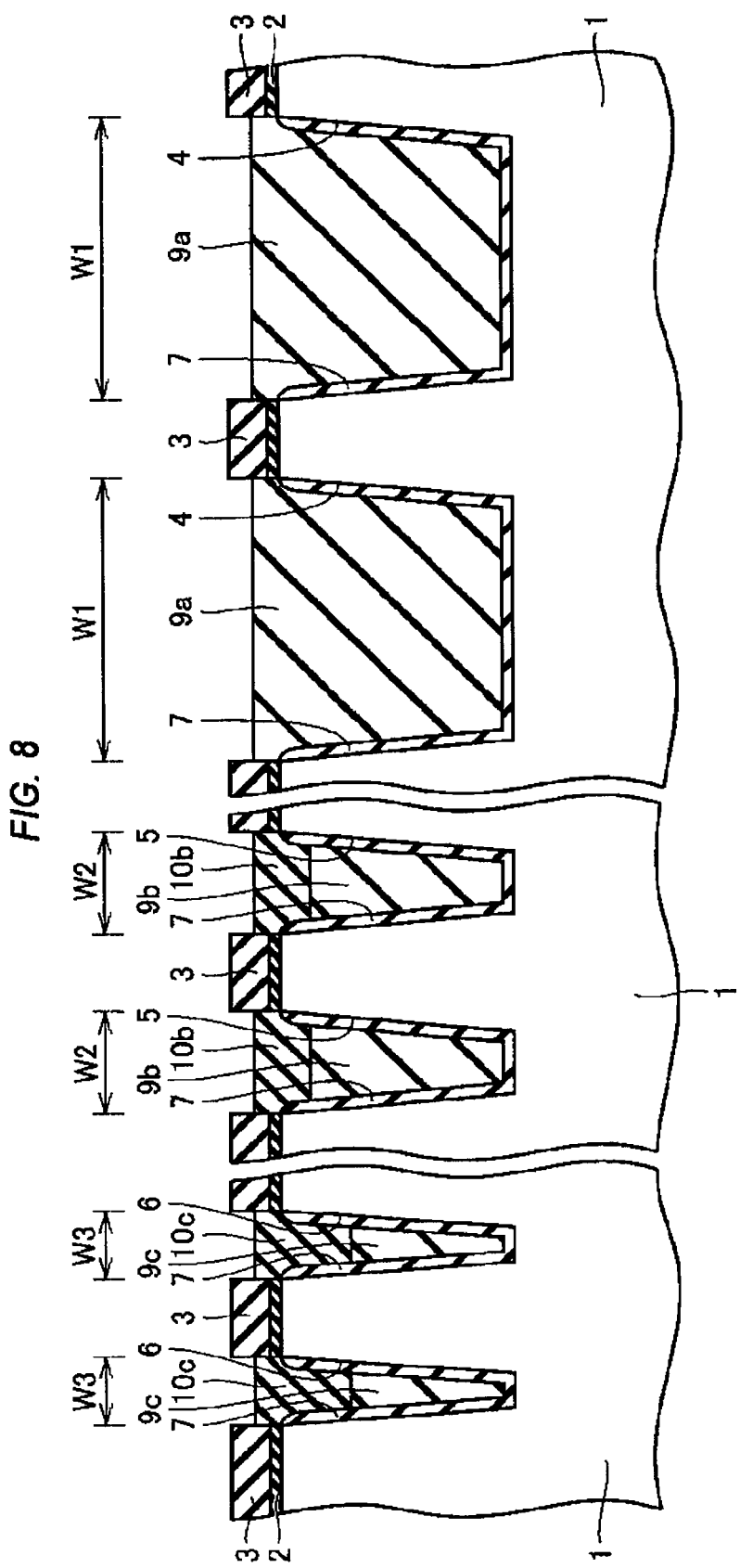
FIG. 8 is a cross-sectional view showing a process performed after the process shown in FIG. 7 in the same Example.

Next, as shown in FIG. 8, a part of the silicon oxide films 10a, 10b and 10c is removed by providing wet etching using hydrofluoric acid (HF). At this time, the wet etching is provided so that the silicon oxide film 10a lying inside the shallow trench isolation 4 is not left.

Next, by providing wet etching by hot phosphoric acid ($H_3PO_4$), the silicon nitride film 3 is removed, and by providing wet etching by diluted hydrofluoric acid (HF) or buffered hydrofluoric acid (BHF), the silicon oxide film 2 is removed. Next, by a thermal oxidation method, a silicon oxide film (not shown), which serves as a screen film when ion implantation is performed, is formed over the surface of the semiconductor substrate 1. Next, by the ion implantation method, well implantation or implantation of intended impurity ions for determining the threshold voltage of a transistor is performed. Next, by providing wet etching again by diluted hydrofluoric acid (HF), or buffered hydrofluoric acid (BHF), the silicon oxide film as the screen film is removed.

Figure 9:
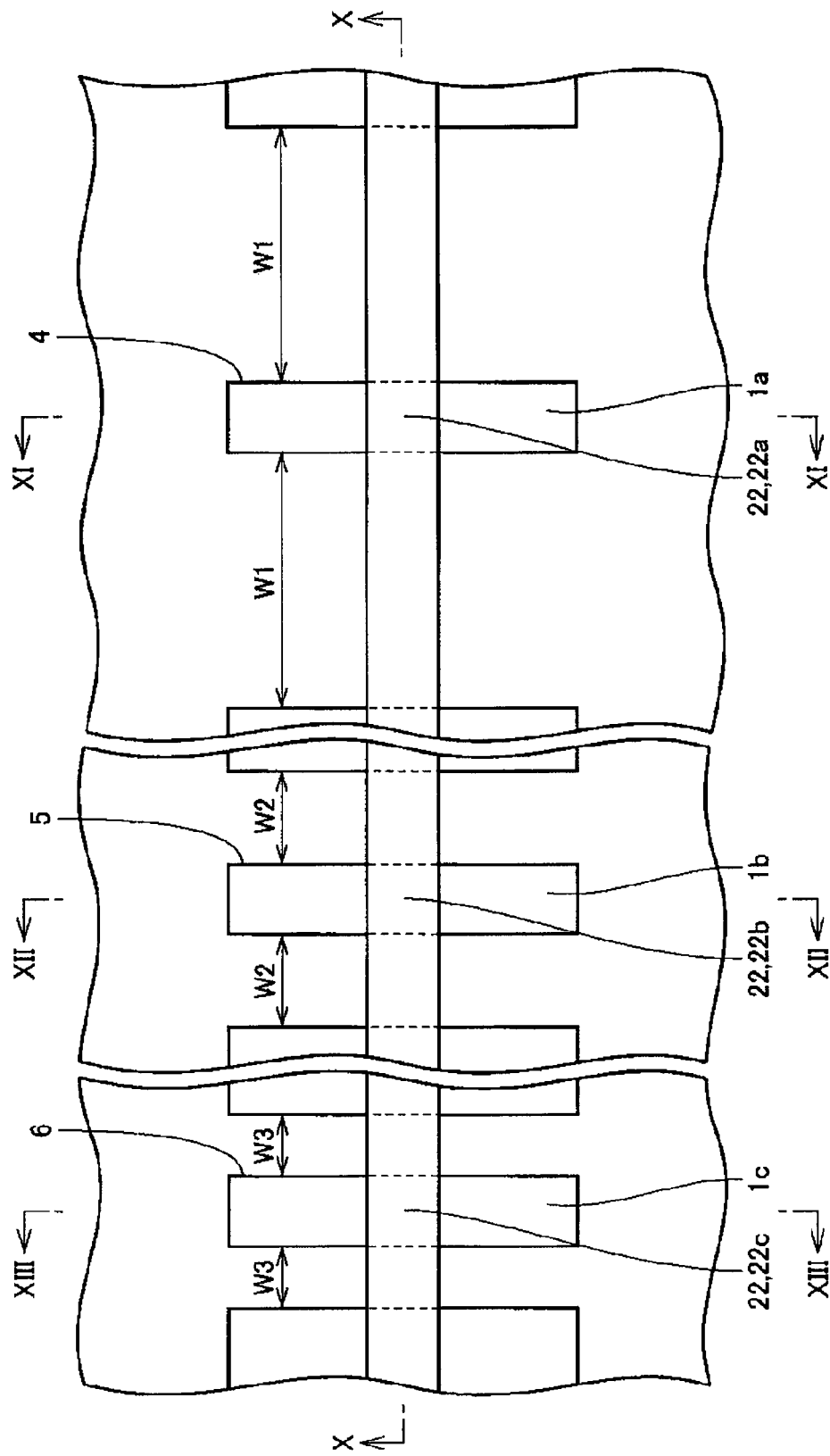
FIG. 9 is a plan view showing a process performed after the process shown in FIG. 8 in the same Example.
Figure 10:
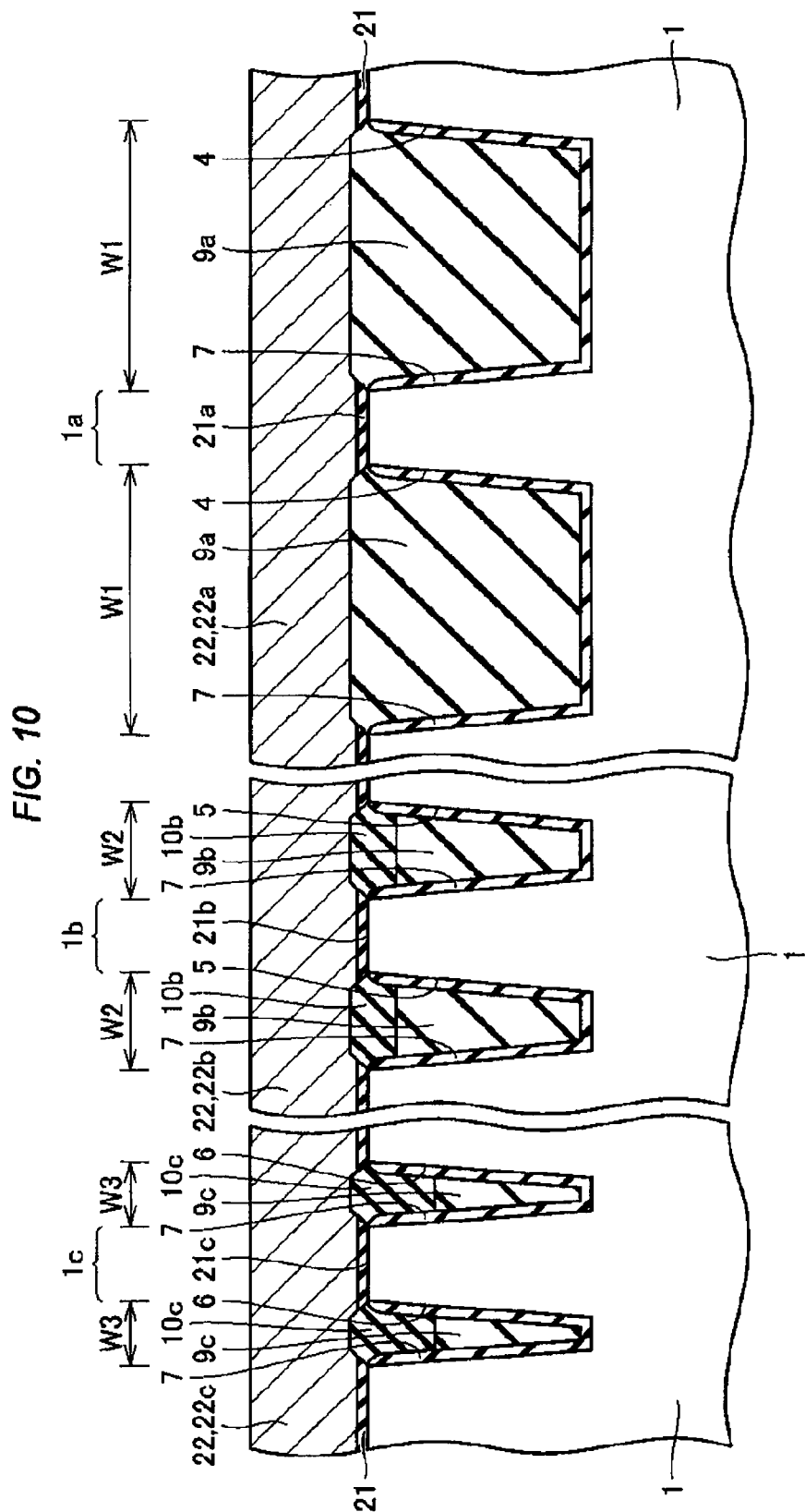
FIG. 10 is a cross-sectional view at a cross-sectional line X-X shown in FIG. 9 in the same Example.

Next, a gate oxide film 21 having a prescribed thickness is formed (refer to FIG. 10). Next, over the gate insulating film, a prescribed electroconductive film (not shown) is formed. By subjecting the electroconductive film to intended photolithography and etching, as shown in FIGS. 9 and 10, a gate electrode 22 is formed in such a mode as crossing element formation regions 1a, 1b and 1c. Next, to regions on one side and regions on another side of the element formation regions 1a, 1b and 1c lying while sandwiching the gate electrode 22, an intended electroconductive type impurity ion is implanted.

Figure 11:
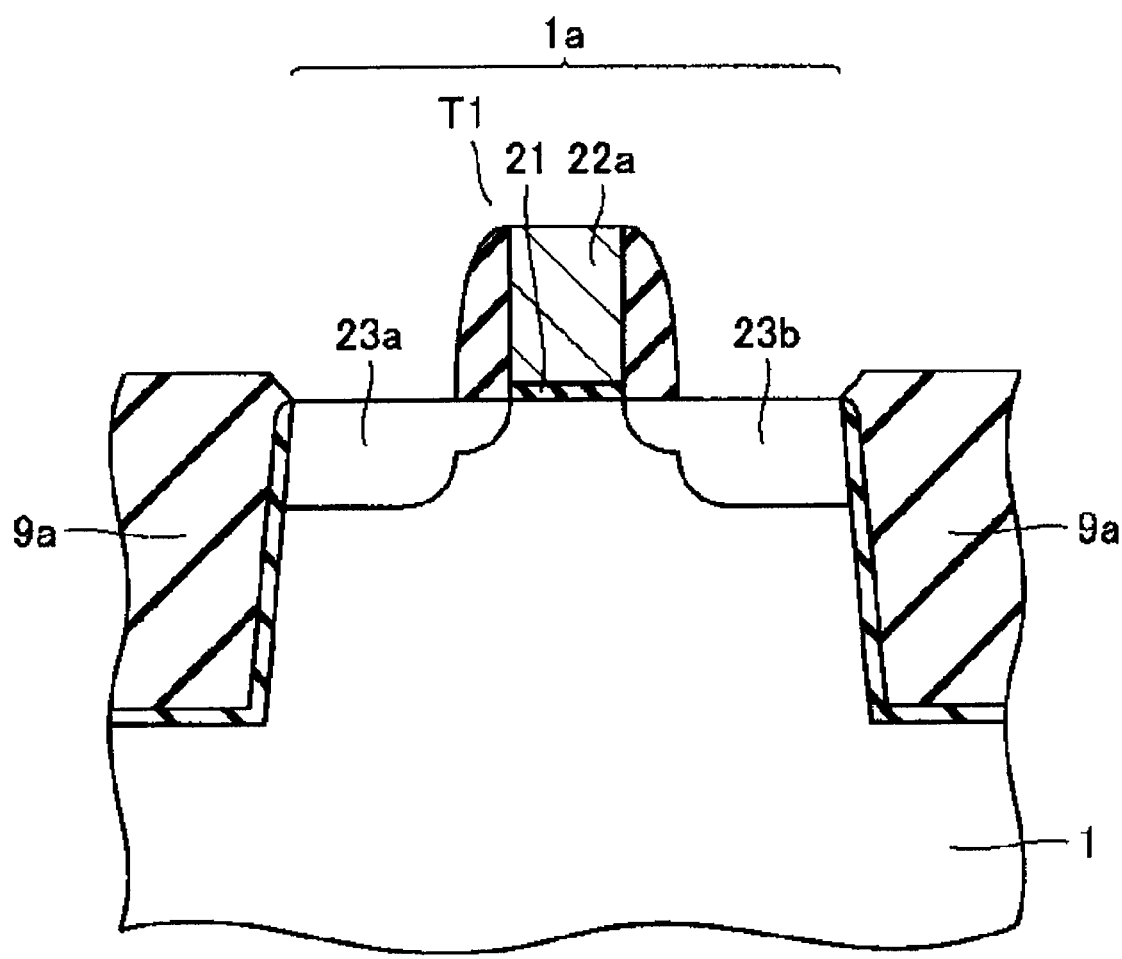
FIG. 11 is a cross-sectional view at a cross-sectional line XI-XI shown in FIG. 9 in the same Example.
Figure 12:
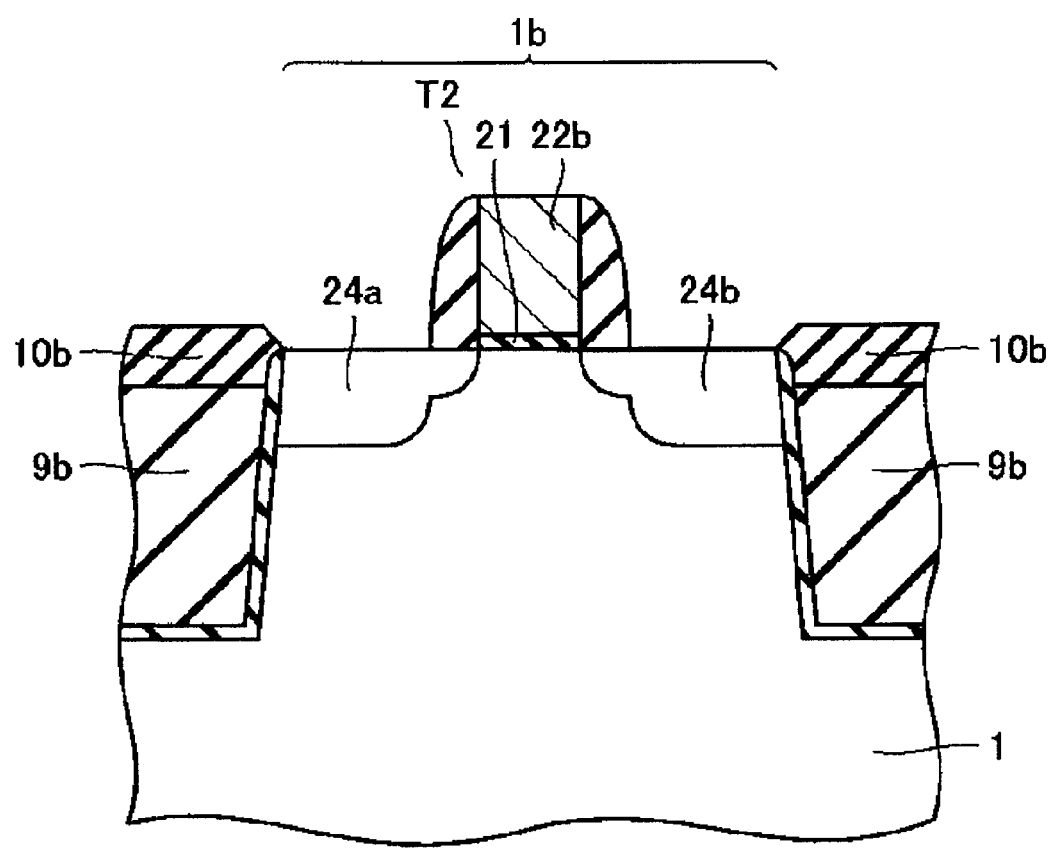
FIG. 12 is a cross-sectional view at a cross-sectional line XII-XII shown in FIG. 9 in the same Example.
Figure 13:
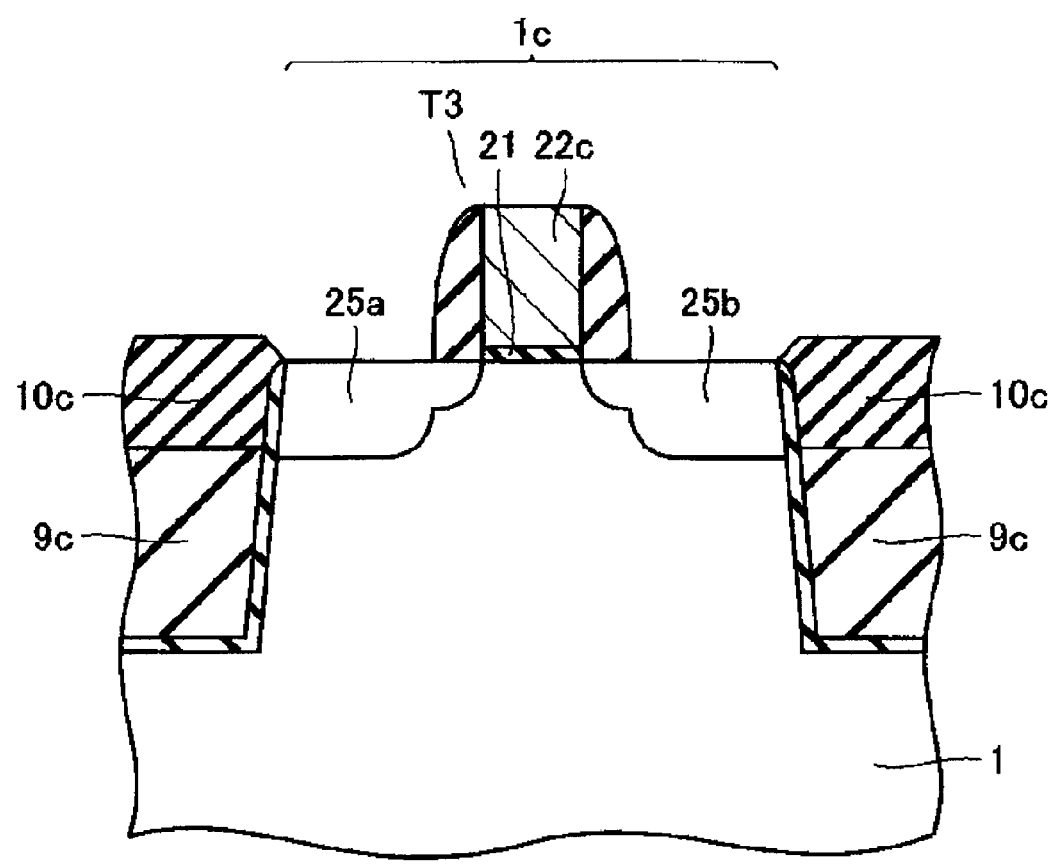
FIG. 13 is a cross-sectional view at a cross-sectional line XIII-XIII shown in FIG. 9 in the same Example.

Thus, as shown in FIG. 11, in the element formation region 1a, a MOS transistor T1 including source/drain regions 23a and 23b and a gate electrode 22a is formed. Also, as shown in FIG. 12, in the element formation region 1b, a MOS transistor T2 including source/drain regions 24a and 24b, and a gate electrode 22b is formed. Further, as shown in FIG. 13, in the element formation region 1c, a MOS transistor T3 including source/drain regions 25a and 25b, and a gate electrode 22c is formed. Meanwhile, in the cross-sectional views in FIGS. 11 to 13, a lamination structure in the shallow trench isolation is shown, while supposedly considering such a case that a shallow trench isolation having the same width as that in the direction of the cross-sectional line X-X is adjacently formed also in the direction of cross-sectional lines XI-XI, XII-XII and XIII-XIII shown in FIG. 9.

In the semiconductor device manufactured through the above processes, it is possible to reduce the variation of electrical characteristics of MOS transistors T1, T2 and T3 formed in each of the element formation regions 1a, 1b and is adjacent to the shallow trench isolations 4, 5 and 6 each having different widths. This will be described in detail.

Firstly, in such a silicon oxide film as a polysilazane film that is formed by the SOD method, when it is subjected to a heat treatment, the contraction percentage of the silicon oxide film depends on the width of the shallow trench isolation. That is, in a silicon oxide film lying in a shallow trench isolation having a wide width, the silicon oxide film tends to be more densified as compared with a silicon oxide film lying in a shallow trench isolation having a narrow width.

Figure 14:
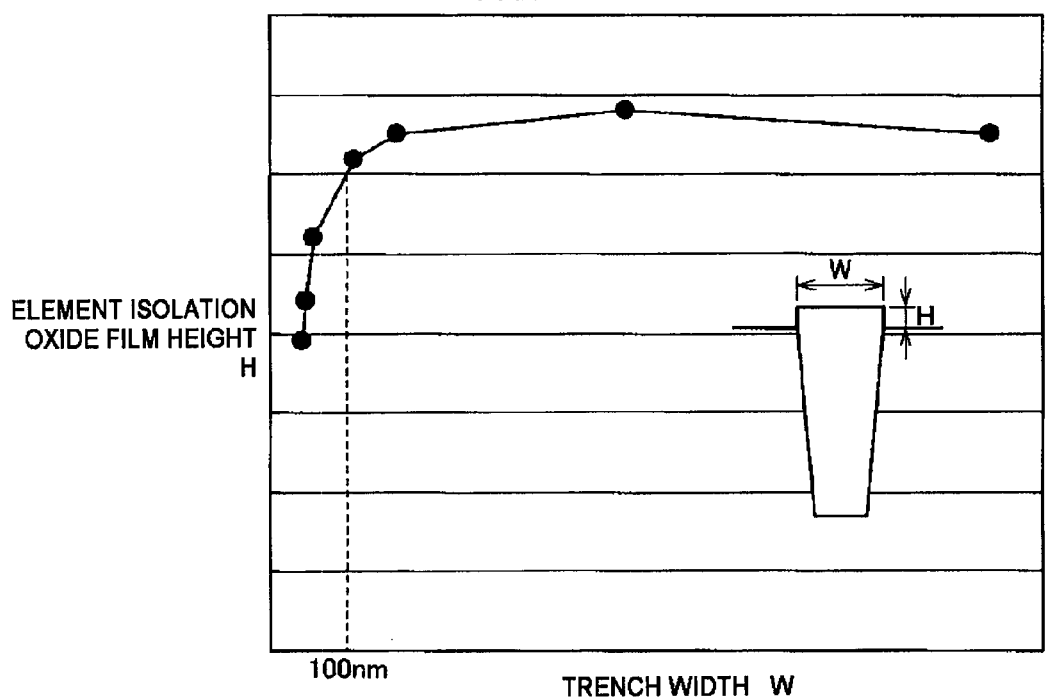
FIG. 14 is a graph showing the relation between the height of the element isolation oxide film and the width of the shallow trench isolation in the same Example.

The present inventors formed a silicon oxide film by the SOD method in shallow trench isolations having various widths, and evaluated the relation between the height H of the element isolation oxide film from the surface of the semiconductor substrate and the width W of the shallow trench isolation, in the state of being finally formed as the element isolation oxide film. FIG. 14 shows the graph of the result. As shown in FIG. 14, it is known that the height H of the element isolation oxide film becomes lower as the width W of the shallow trench isolation becomes narrower. The reason is that an element isolation oxide film formed in a shallow trench isolation having a narrower width is more hardly densified, and that the silicon oxide film is more etched by etching when the element isolation oxide film is formed.

That the height of the element isolation oxide film varies depending on the width of the shallow trench isolation causes, as previously stated, the increase in the variation of the dimension of the gate or electrical characteristics of transistors formed in element formation regions surrounded by the shallow trench isolation.

Figure 15:
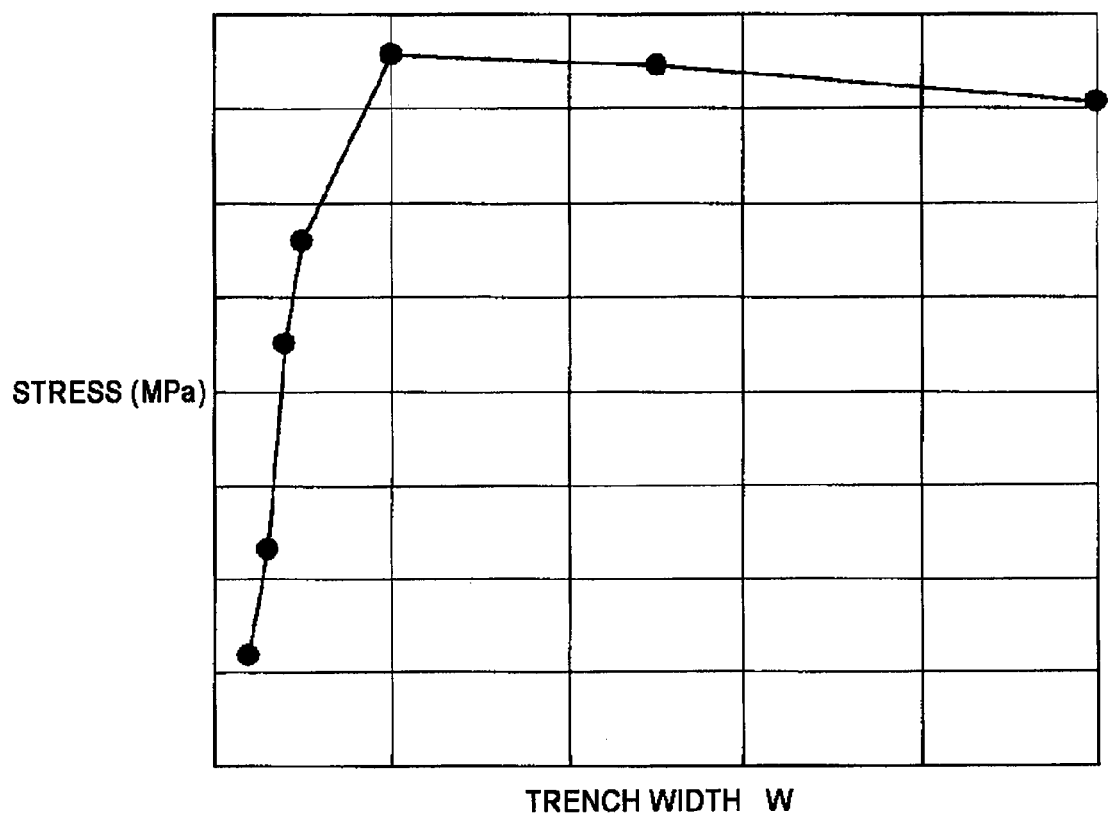
FIG. 15 is a graph showing the relation between the stress of a silicon oxide film and the width of the shallow trench isolation in the same Example.

Moreover, the variation of the densification degree of the silicon oxide film depending on the width of the shallow trench isolation leads to the variation of stress applied on element formation regions surrounded by shallow trench isolations. The present inventors evaluated the relation between the stress of the element formation region and the width W of the adjacent shallow trench isolation. As a sample, a pattern, in which the pattern of the element formation region and the pattern of the shallow trench isolation were arranged in a line-and-space pattern, was prepared and a shallow trench isolation (STI) was formed, and then the stress of the element formation region was measured by UV Raman spectroscopy. FIG. 15 shows the graph of results.

As shown in FIG. 15, it is known that, when the width of a shallow trench isolation adjacent to the element formation region becomes narrower than a certain value, as a width W of shallow trench isolation becomes more and more narrower, stress of the element formation region becomes smaller. This generates the difference in electrical characteristics of MOS transistors depending on the width of the shallow trench isolation adjacent to the element formation region, even when MOS transistors have the same size.

In the aforementioned semiconductor device, by utilizing such a property that the wet etching rate of the silicon oxide film 9 (the lower layer) formed in the gap for the shallow trench isolations 4, 5 and 6 becomes higher as the width of the shallow trench isolation becomes narrower, it is possible to reduce the variation in compressive stress of the element isolation oxide film finally formed in the gap for the shallow trench isolations having various widths.

Figure 16:
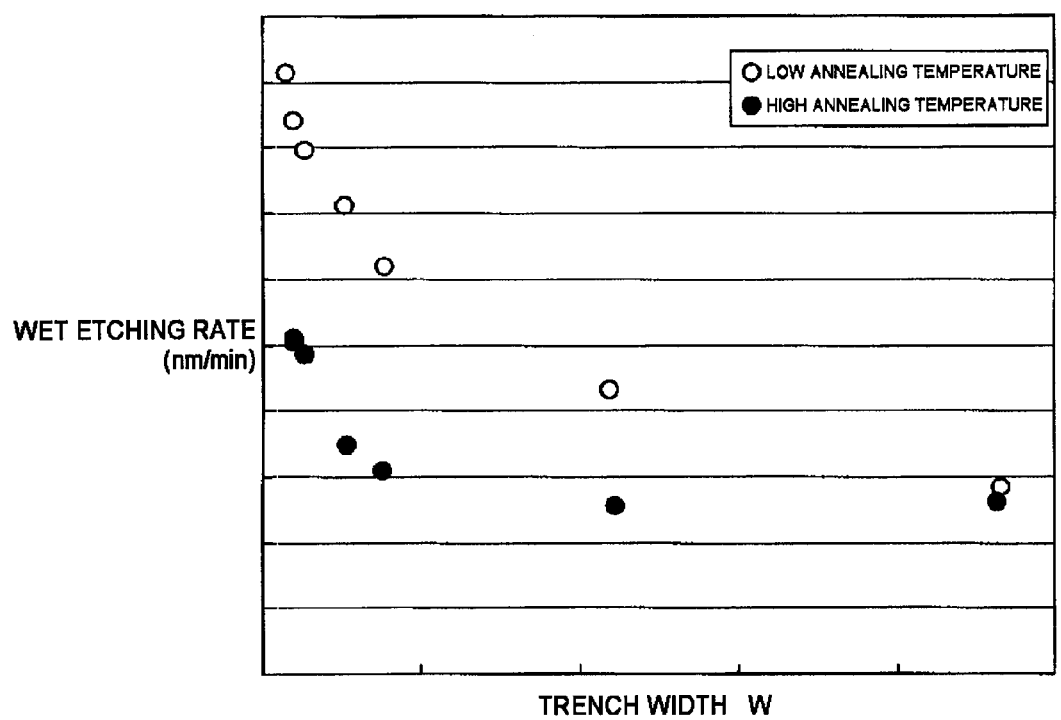
FIG. 16 is a graph showing the relation between the wet etching rate of the silicon oxide film and the width of the shallow trench isolation in the same Example.

Firstly, FIG. 16 shows the graph of the relation between the wet etching rate of the silicon oxide film and the width of the shallow trench isolation. In the evaluation, the present inventors provided annealing treatments for a silicon oxide film formed in the gap for the shallow trench isolations having various widths by putting it in relatively high and low temperatures in an inert gas atmosphere, and measured the wet etching rate of the silicon oxide film having been subjected to the annealing treatment. As shown in FIG. 16, it is known that the wet etching rate of the silicon oxide film formed in the gap for the shallow trench isolation becomes higher as the width of the shallow trench isolation becomes narrower, and that the wet etching rate can be adjusted by changing the annealing temperature.

Thus, since the wet etching rate of the silicon oxide film 9 (a lower layer) formed in a gap for the shallow trench isolation having a narrower width is larger, the thickness of the silicon oxide film 9 left in a gap for shallow trench isolation having a relatively narrow width becomes thinner than the thickness of the silicon oxide film 9 left in a gap for the shallow trench isolation having a relatively wider width. Then, the silicon oxide film 10 (an upper layer) by the HDP-CVD method with a comparatively high compressive stress is more thickly laminated over the silicon oxide film 9 in the lower layer by the thinned thickness of the silicon oxide film 9, and the compressive stress of the element isolation oxide film finally formed in the gap for the shallow trench isolation having a relatively narrower width is more raised.

Figure 17:
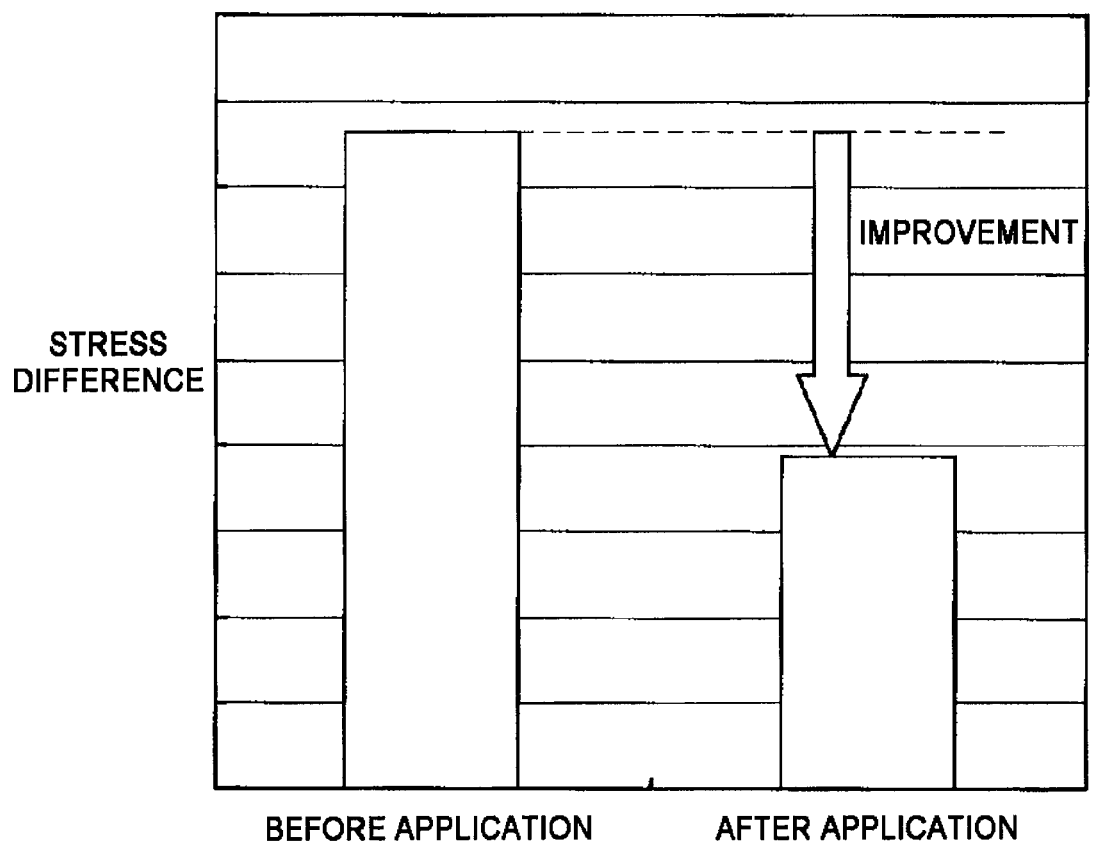
FIG. 17 is a graph showing the improvement effect of the stress difference of the silicon oxide film in the same Example.

As shown in FIG. 17, this reduces the difference in stress before and after the application of the aforementioned manufacturing method, that is, difference between the compressive stress of the isolation oxide film finally formed in the gap for the shallow trench isolation having a relatively narrow width and the compressive stress of the isolation oxide film finally formed in the gap for the shallow trench isolation having a relatively wide width is reduced. As the result, the variation of the compressive stress acting on the element formation regions 1a, 1b and 1c to which the shallow trench isolations 4, 5 and 6 having various widths are adjacent is reduced, and the variation of electrical characteristics of MOS transistors T1, T2 and T3 formed in each of the element formation regions 1a, 1b and 1c can be reduced.

Example 2

Regarding the aforementioned semiconductor device, the description was given while mentioning a case where a polysilazane film was formed by the SOD method as the silicon oxide film (the lower layer) formed in the gap for the shallow trench isolation as an example. Here, the description will be given while mentioning a case where a silicon oxide film is formed by $O_3$-TEOS.

Figure 18:
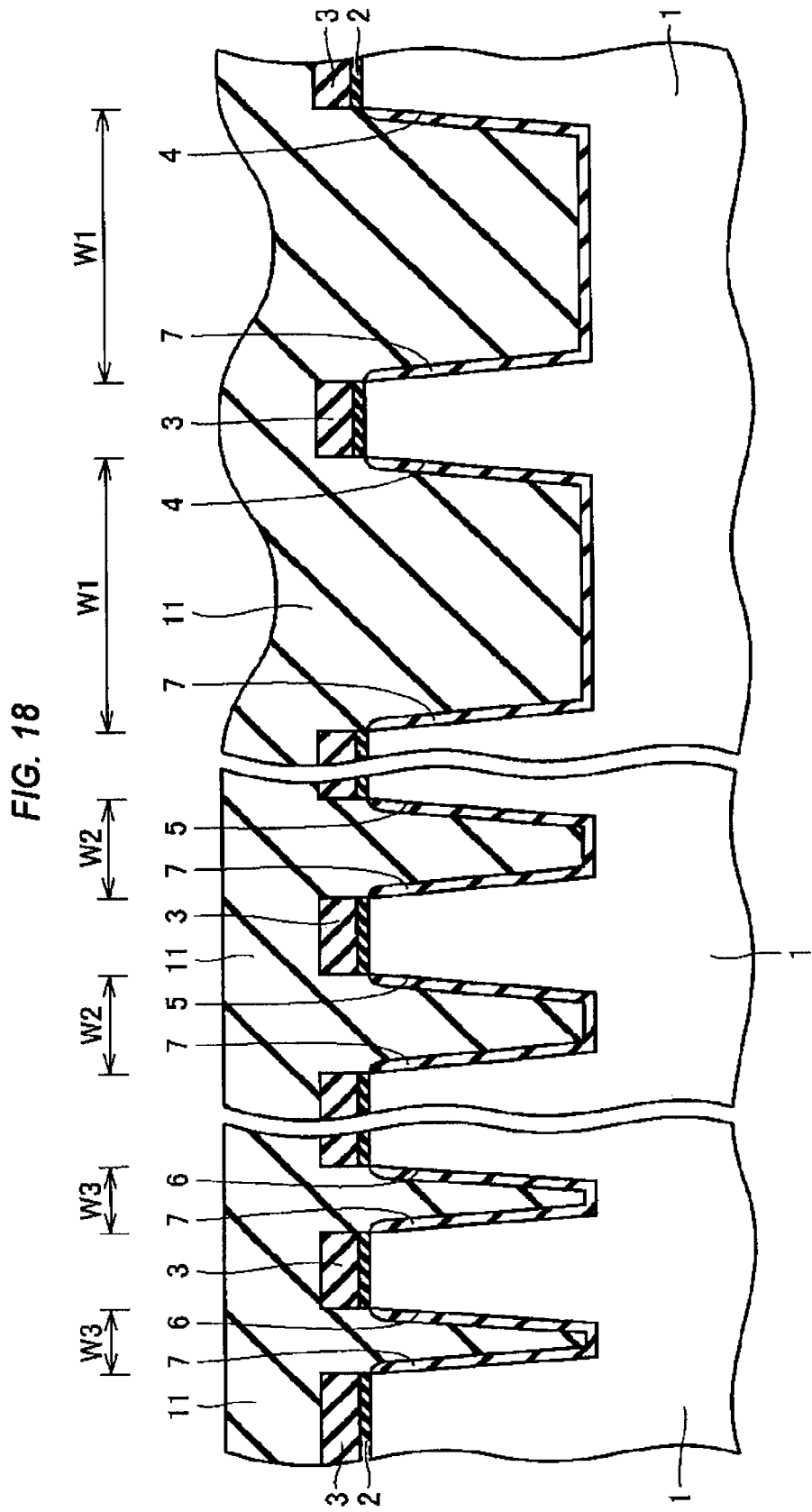
FIG. 18 is a cross-sectional view showing a process of a method of manufacturing of a semiconductor device according to Example 2 of the present invention.
Figure 19:
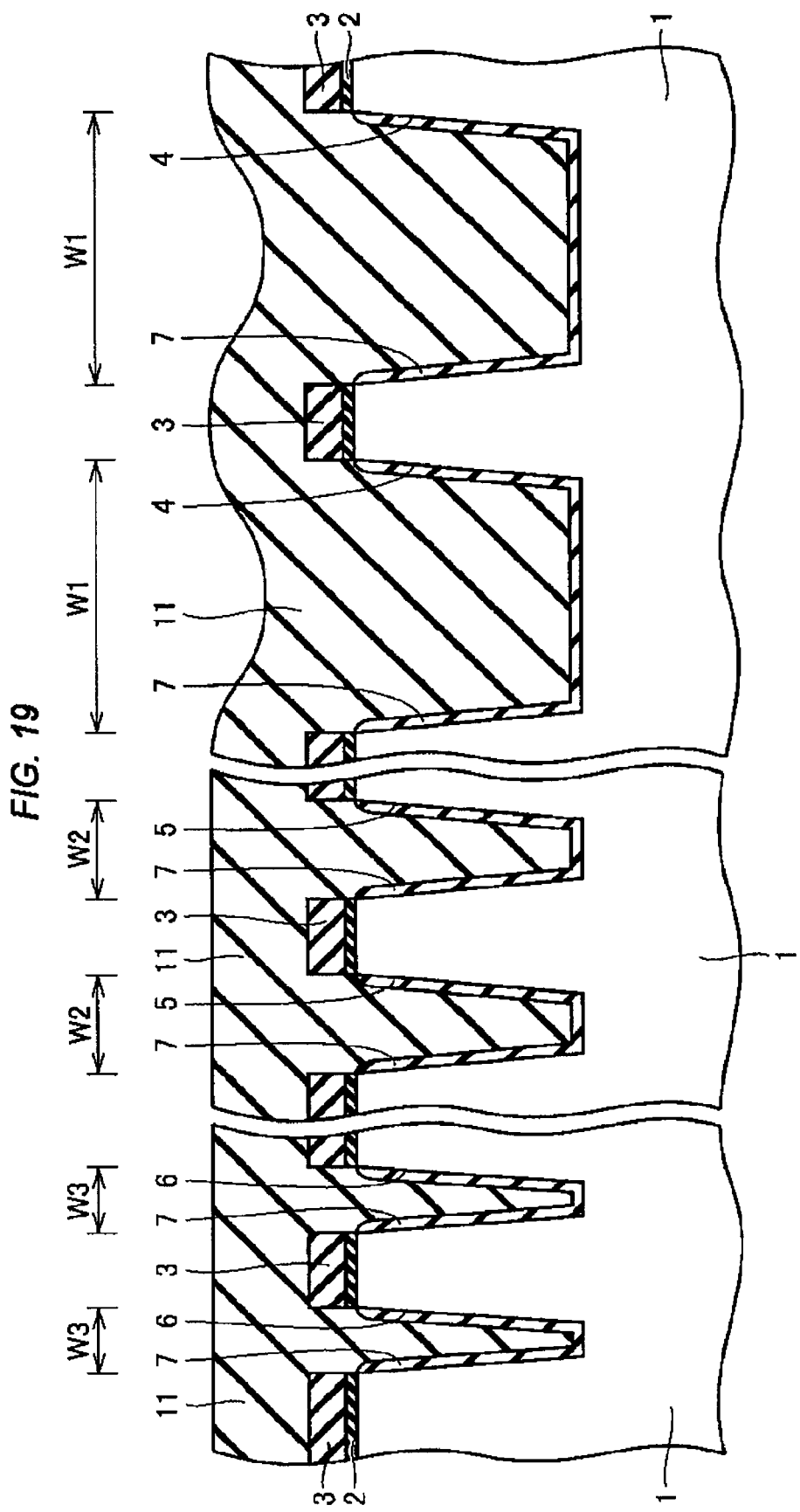
FIG. 19 is a cross-sectional view showing a process performed after the process shown in FIG. 18 in the same Example.

After the aforementioned process shown in FIG. 1, as shown in FIG. 18, a silicon oxide film 11 is formed by the CVD method using a mixed gas of $O_3$ and TEOS over the semiconductor substrate 1 in such a mode as filling the gap for the shallow trench isolations 4, 5 and 6. Next, as shown in FIG. 19, the silicon oxide film 11 is densified by subjecting it to a heat treatment in an inert gas atmosphere at a temperature of 900 to 1100° C. Meanwhile, prior to the heat treatment, it may be subjected to a heat treatment in a water vapor atmosphere at a temperature of 300 to 900° C.

Figure 20:
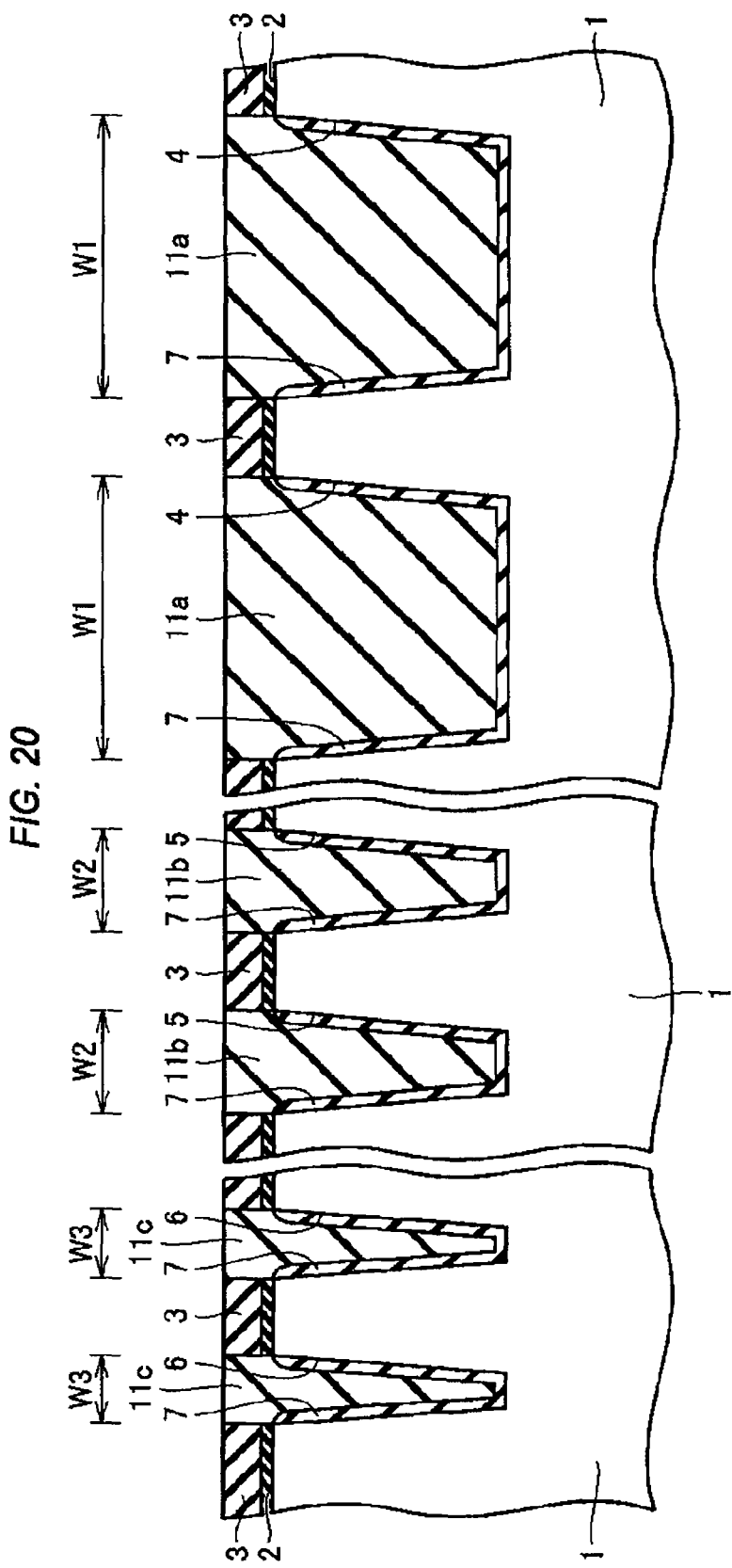
FIG. 20 is a cross-sectional view showing a process performed after the process shown in FIG. 19 in the same Example.
Figure 21:
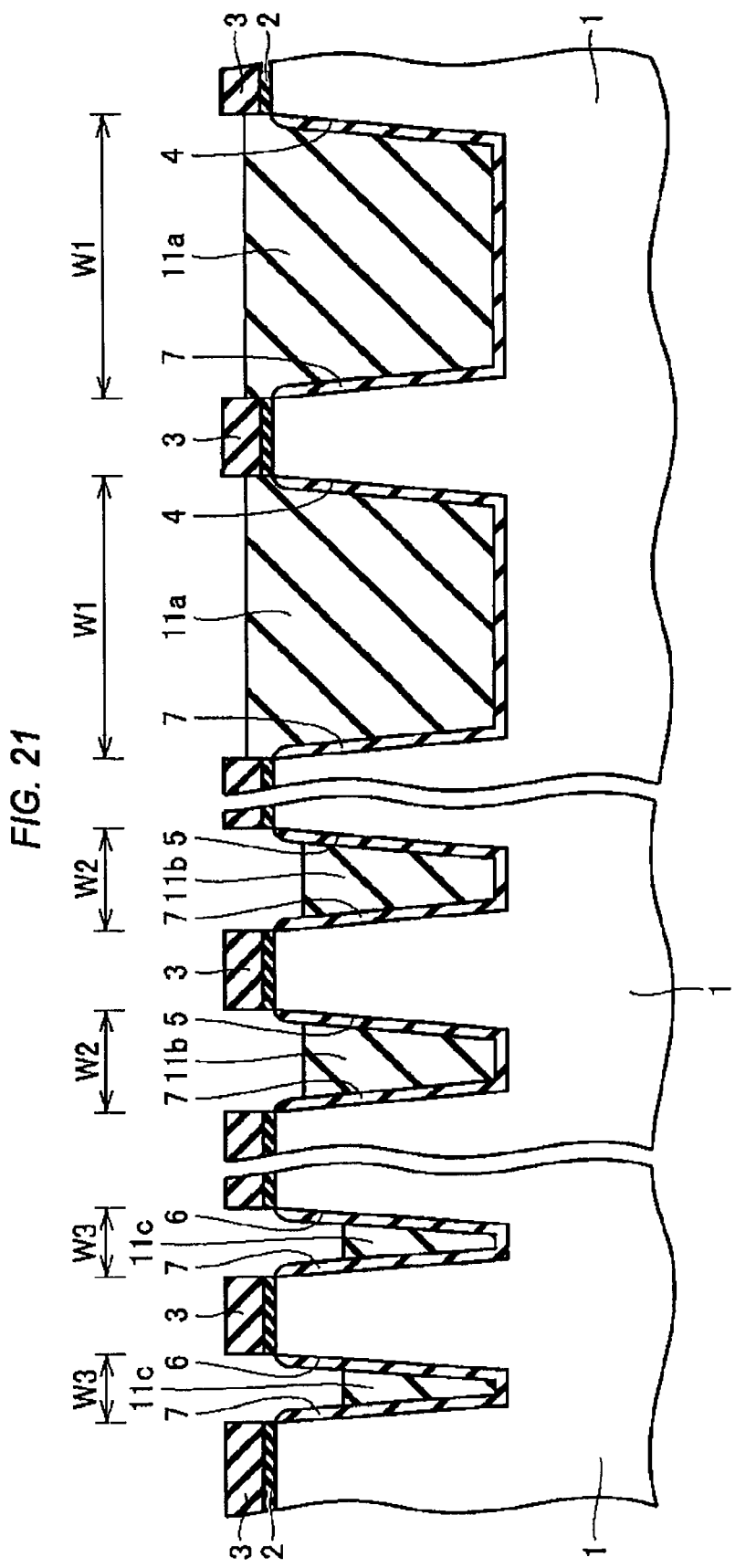
FIG. 21 is a cross-sectional view showing a process performed after the process shown in FIG. 20 in the same Example.

Next, as shown in FIG. 20, a part of the silicon oxide film 11 lying above the upper surface of the silicon nitride film 3 is removed by the CMP method using the silicon nitride film 3 as a stopper film. Thus, silicon oxide films 11a, 11b and 11c are left inside the shallow trench isolations 4, 5 and 6, respectively. Next, as shown in FIG. 21, by providing a wet etching treatment using diluted hydrofluoric acid (diluted HF) or buffered hydrofluoric acid (BHF), the silicon oxide film 11 is etched.

At this time, as described above, among the silicon oxide films 11a, 11b and 11c lying inside the gap for the shallow trench isolations 4, 5 and 6, respectively, the silicon oxide film 11c has the highest etching rate, and the silicon oxide film 11a has the lowest etching rate. As the result, the silicon oxide film 11a, 11b and 11c lying inside the gap for the shallow trench isolations 4, 5 and 6 are selectively etched, and the position of the upper surface of the silicon oxide film 11c is lowest and the position of the upper surface of the silicon oxide film 11a is highest.

Moreover, at this time, the wet etching amount of silicon oxide films 11a, 11b and 11c is determined so that the height of the silicon oxide film 11a lying in the gap for the shallow trench isolation 4 having a relatively wide trench width is upper than the boundary between the silicon nitride film 3 and the silicon oxide film 2 and is nearly higher than the height of the element isolation oxide film at the time point of the completion of the element isolation structure. Specifically, it is desirable that the height of the element isolation film at the time point of the completion is set to be higher than at least the surface of the silicon substrate 1, for the purpose of avoiding such a problem of an inverse narrow channel effect caused by the enclosure of the end of the element formation region by a gate electrode, or a problem caused by the stay of etching residues of a gate electrode material in a lowered portion (a fallen portion) that might occur if the surface of the element isolation film lies at a position lower than the surface of the silicon substrate 1.

Figure 22:
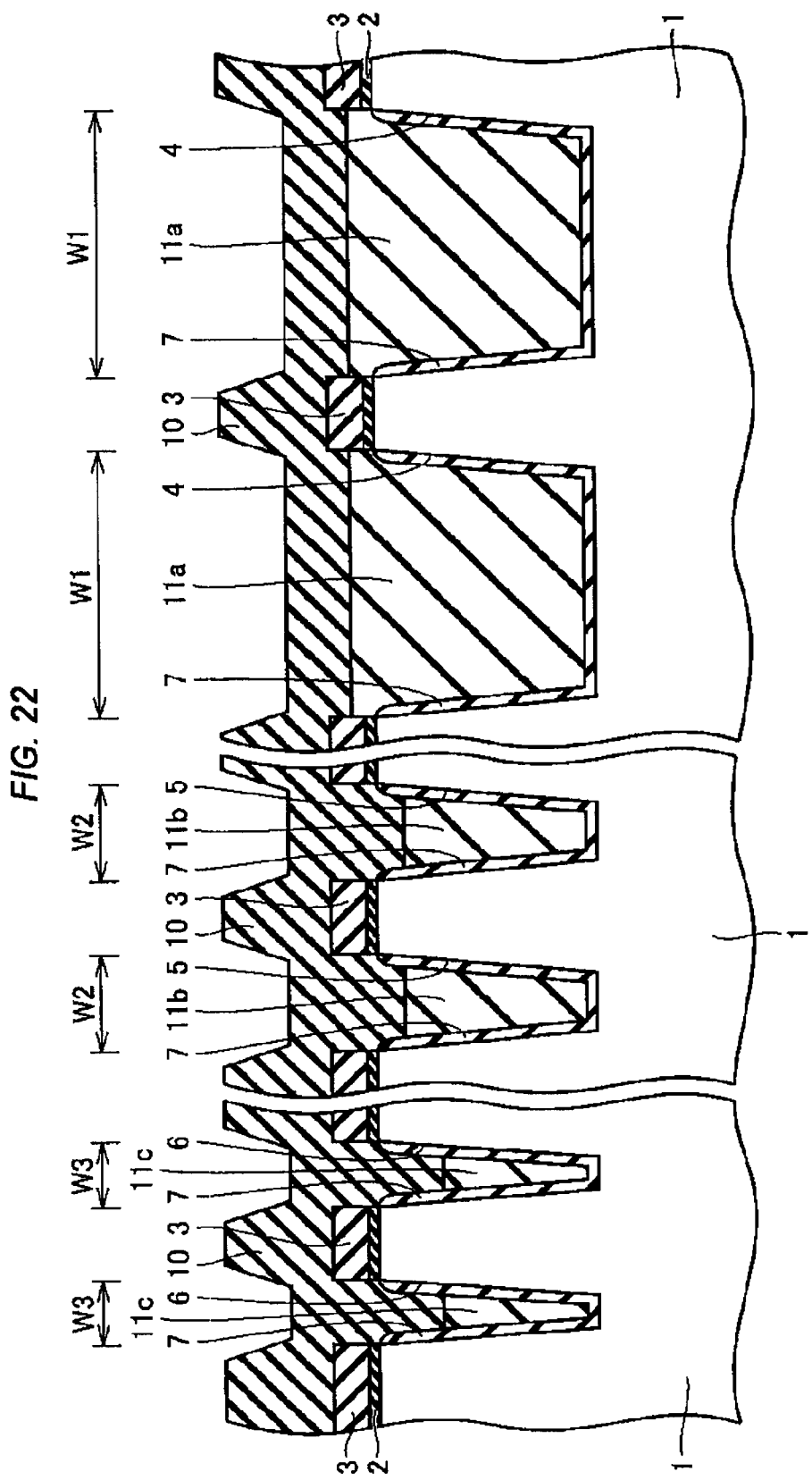
FIG. 22 is a cross-sectional view showing a process performed after the process shown in FIG. 21 in the same Example.

Next, as shown in FIG. 22, the silicon oxide film 10 is formed using the HDP-CVD method over the semiconductor substrate 1 so as to cover the silicon oxide films 11a, 11b and 11c. As the result of using the HDP-CVD method, the density of the silicon oxide film 10 becomes higher than the density of silicon oxide films 11a, 11b and 11c. Meanwhile, a heat treatment may be provided after the formation of the silicon oxide film 10.

Figure 23:
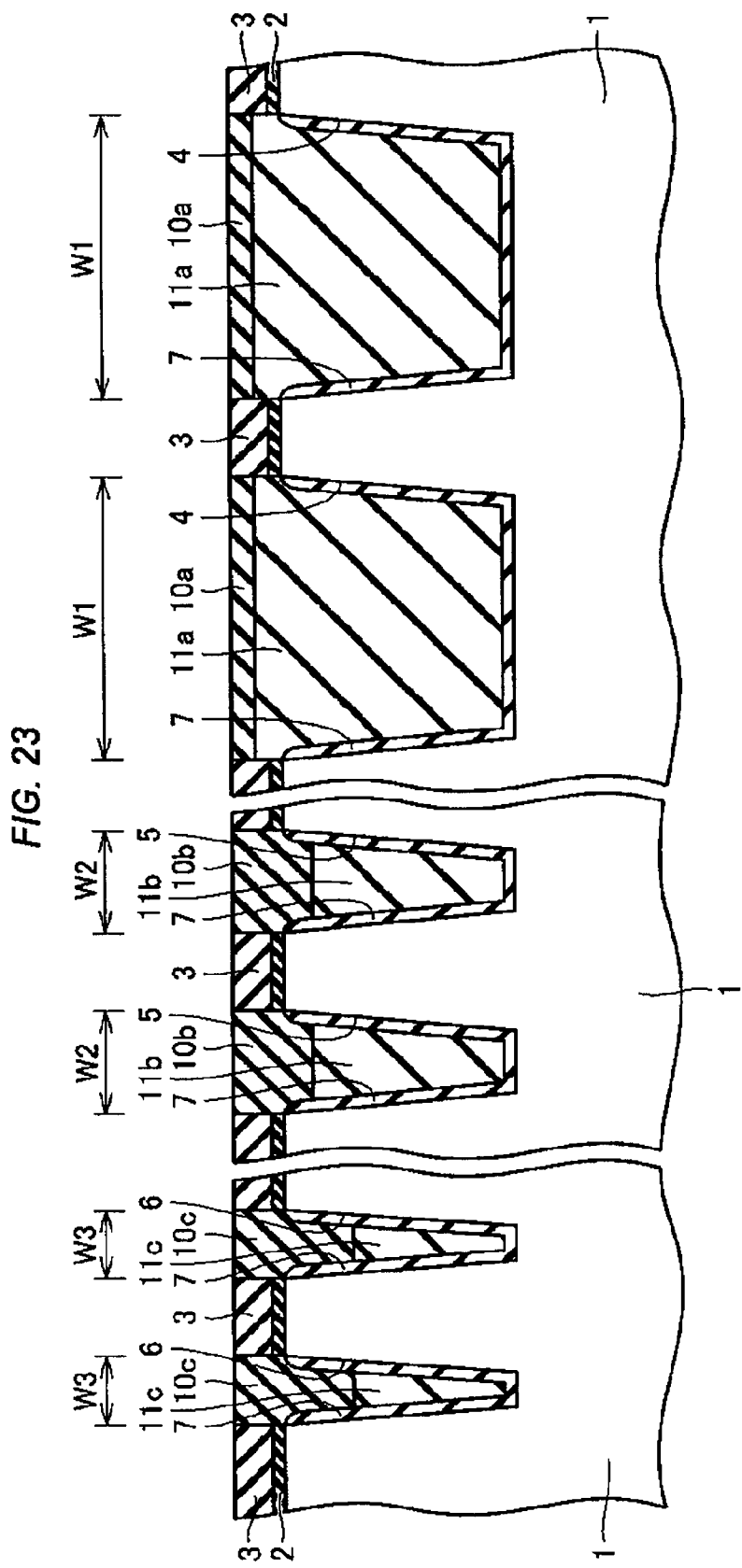
FIG. 23 is a cross-sectional view showing a process performed after the process shown in FIG. 22 in the same Example.

Next, as shown in FIG. 23, the portion of the silicon oxide film 10 lying upper than the upper surface of the silicon nitride film 3 is removed by the CMP method using the silicon nitride film 3 as a stopper film to flatten the surface of the semiconductor substrate 1. As described above, inside the shallow trench isolation 4, the silicon oxide film 10a is left over the silicon oxide film 11a, and, inside the shallow trench isolation 5, the silicon oxide film 10b is left over the silicon oxide film 11b. Moreover, inside the shallow trench isolation 6, the silicon oxide film 10c is left over the silicon oxide film 11c.

Figure 24:
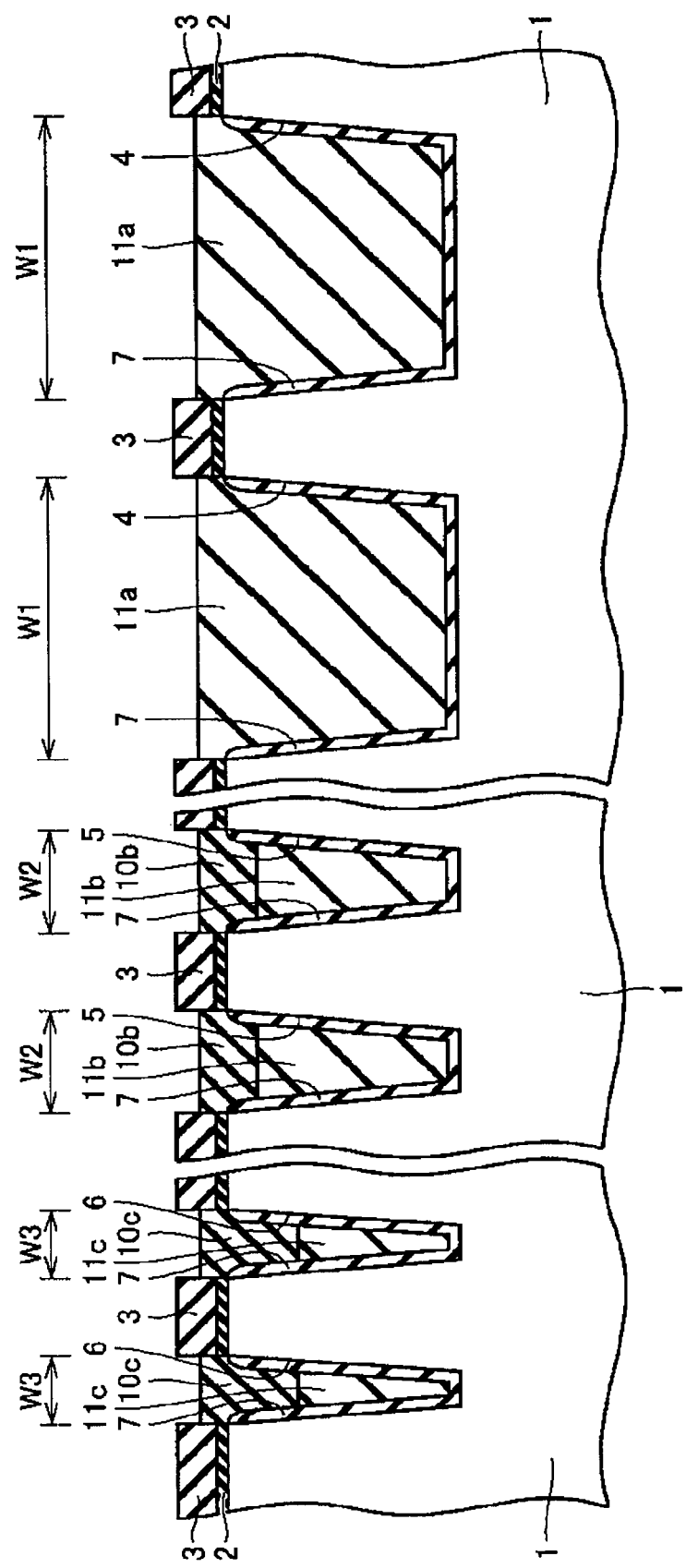
FIG. 24 is a cross-sectional view showing a process performed after the process shown in FIG. 23 in the same Example.

Next, as shown in FIG. 24, a part of the silicon oxide films 10a, 10b and 10c is removed by providing wet etching using hydrofluoric acid (HF) or buffered hydrofluoric acid (BHF). At this time, the wet etching is provided so that the silicon oxide film 10a lying inside the gap for the shallow trench isolation 4 is not left.

Next, by providing wet etching by hot phosphoric acid ($H_3PO_4$), the silicon nitride film 3 is removed, and by providing wet etching by diluted hydrofluoric acid (HF) or buffered hydrofluoric acid (BHF), the silicon oxide film 2 is removed. Next, by a thermal oxidation method, a silicon oxide film (not shown), which serves as a screen film when ion implantation is performed, is formed over the surface of the semiconductor substrate 1. Next, by the ion implantation method, well implantation or implantation of intended impurity ions for determining the threshold voltage of a transistor is performed. Next, by providing wet etching again by diluted hydrofluoric acid (HF), or buffered hydrofluoric acid (BHF), the silicon oxide film as the screen film is removed.

Figure 25:
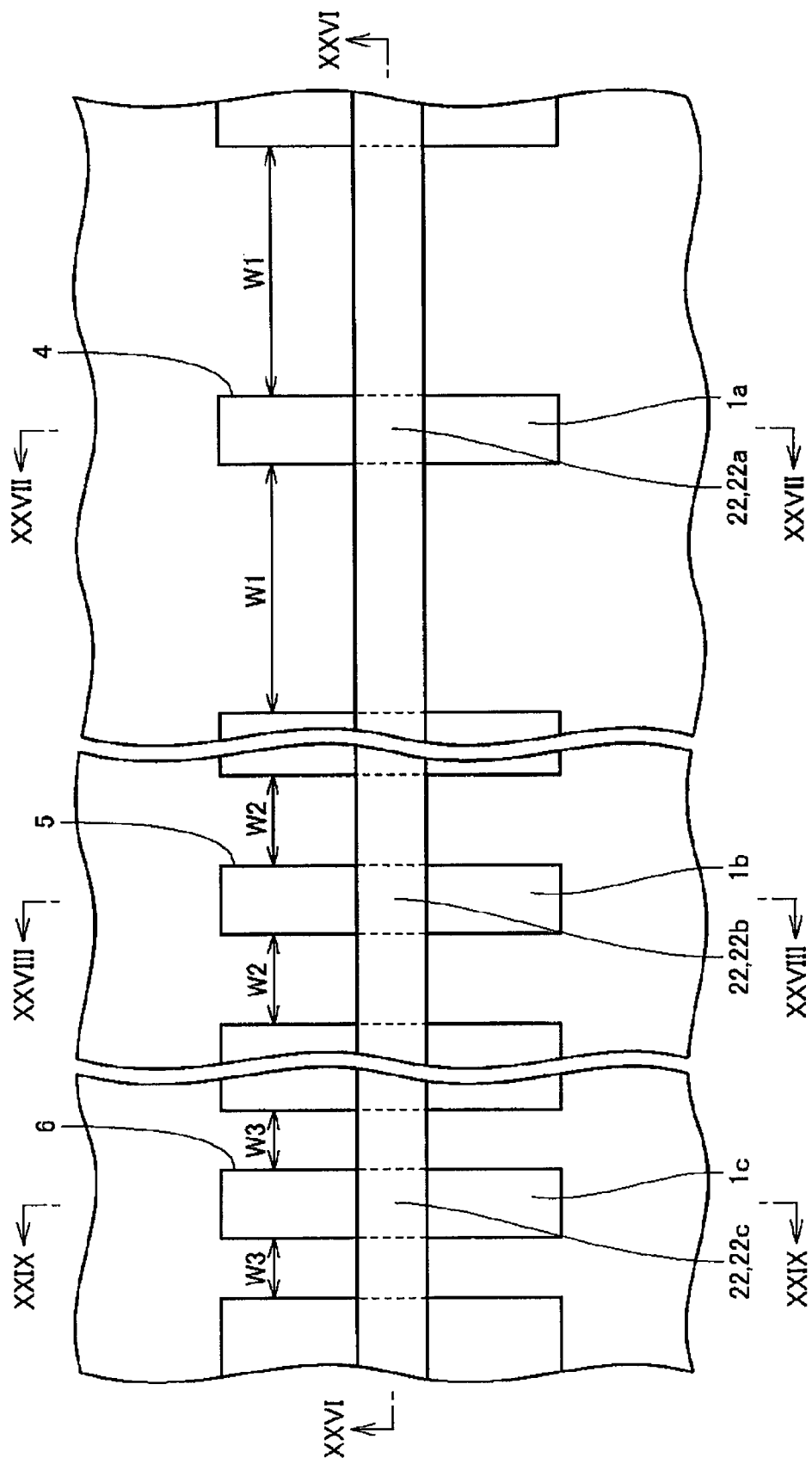
FIG. 25 is a plan view showing a process performed after the process shown in FIG. 24 in the same Example.
Figure 26:
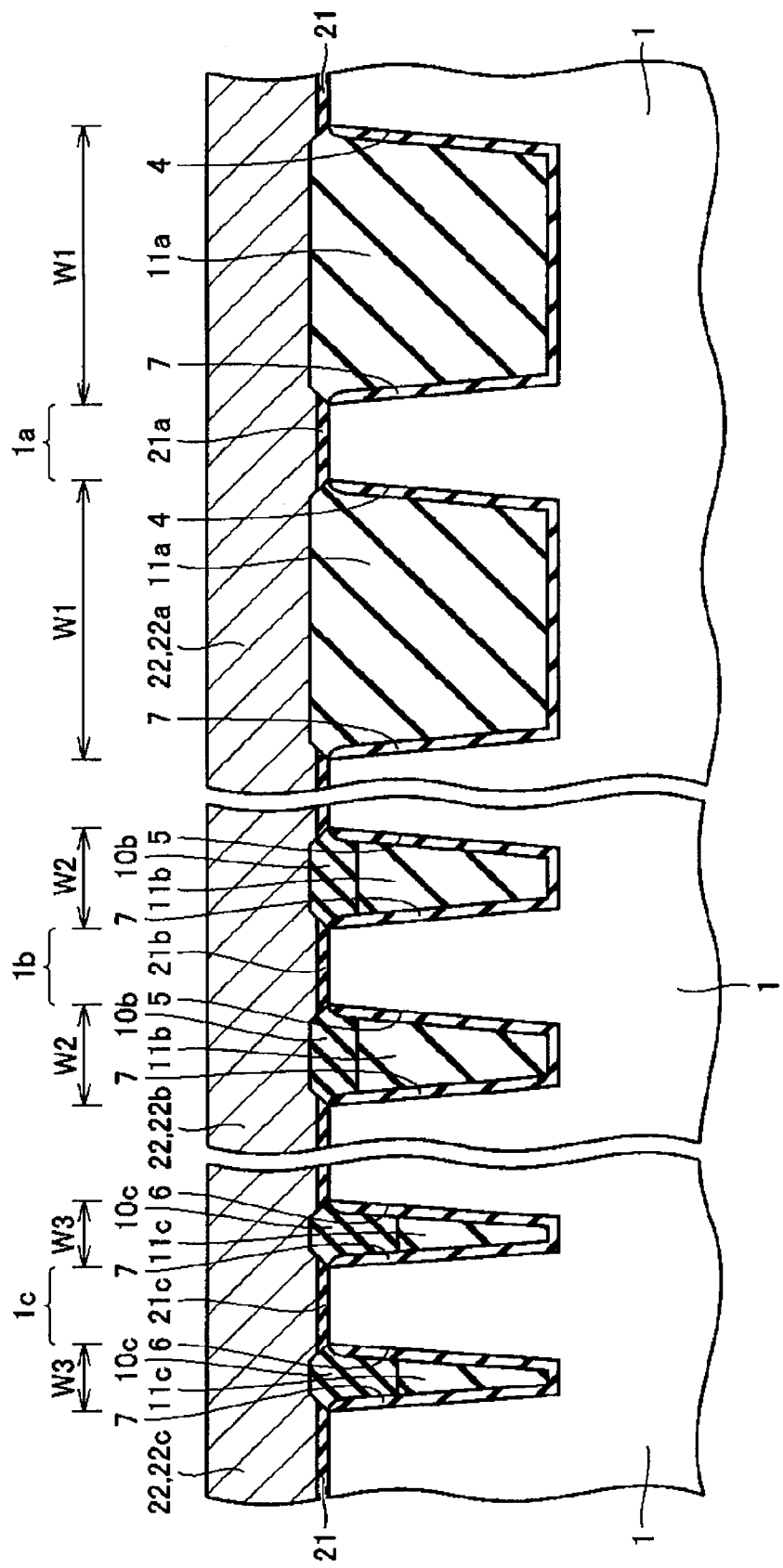
FIG. 26 is a cross-sectional view at a cross-sectional line XXVI-XXVI shown in FIG. 25 in the same Example.

Next, a gate oxide film 21 having a prescribed thickness is formed (refer to FIG. 26). Next, over the gate insulating film, a prescribed electroconductive film (not shown) is formed. By subjecting the electroconductive film to intended photolithography and etching, as shown in FIGS. 25 and 26, a gate electrode 22 is formed in such a mode as crossing the element formation regions 1a, 1b and 1c. Next, to regions on one side and regions on another side of the element formation regions 1a, 1b and is lying while sandwiching the gate electrode 22, an intended electroconductive type impurity ion is implanted.

Figure 27:
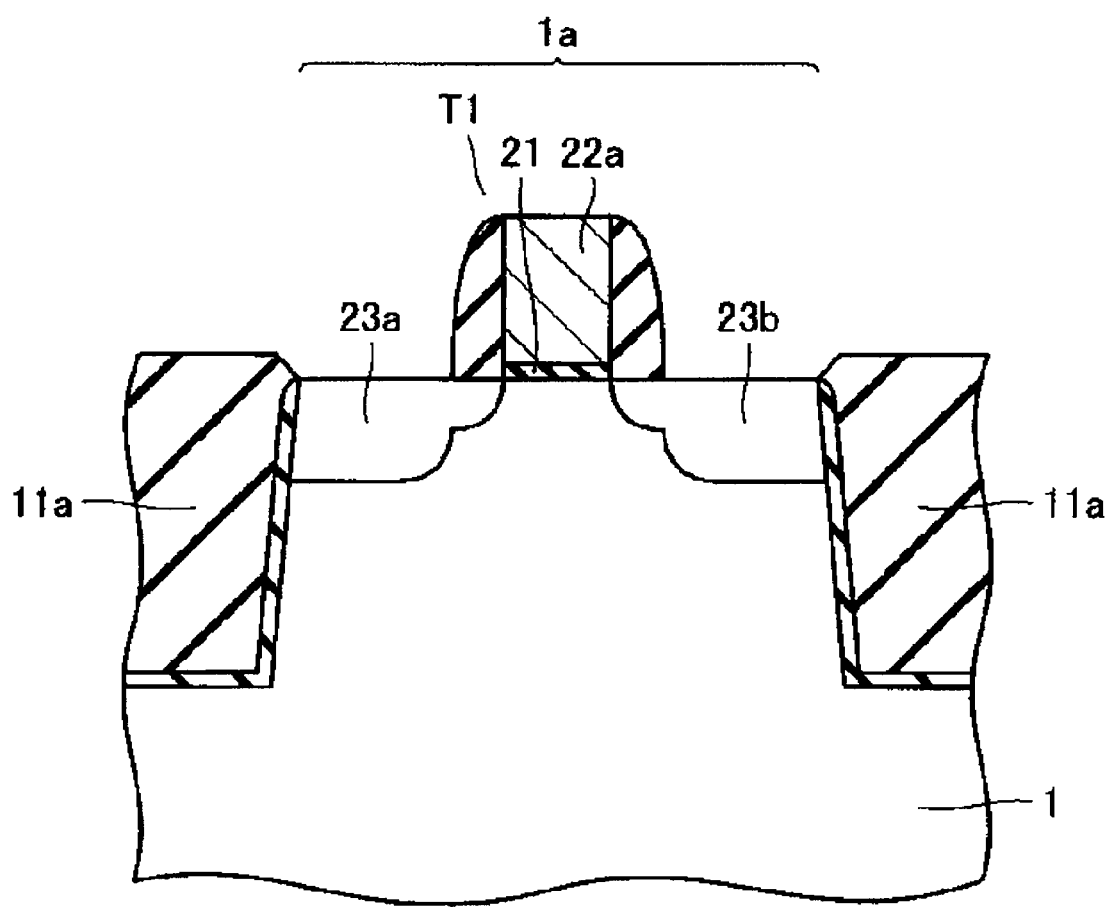
FIG. 27 is a cross-sectional view at a cross-sectional line XXVII-XXVII shown in FIG. 25 in the same Example.
Figure 28:
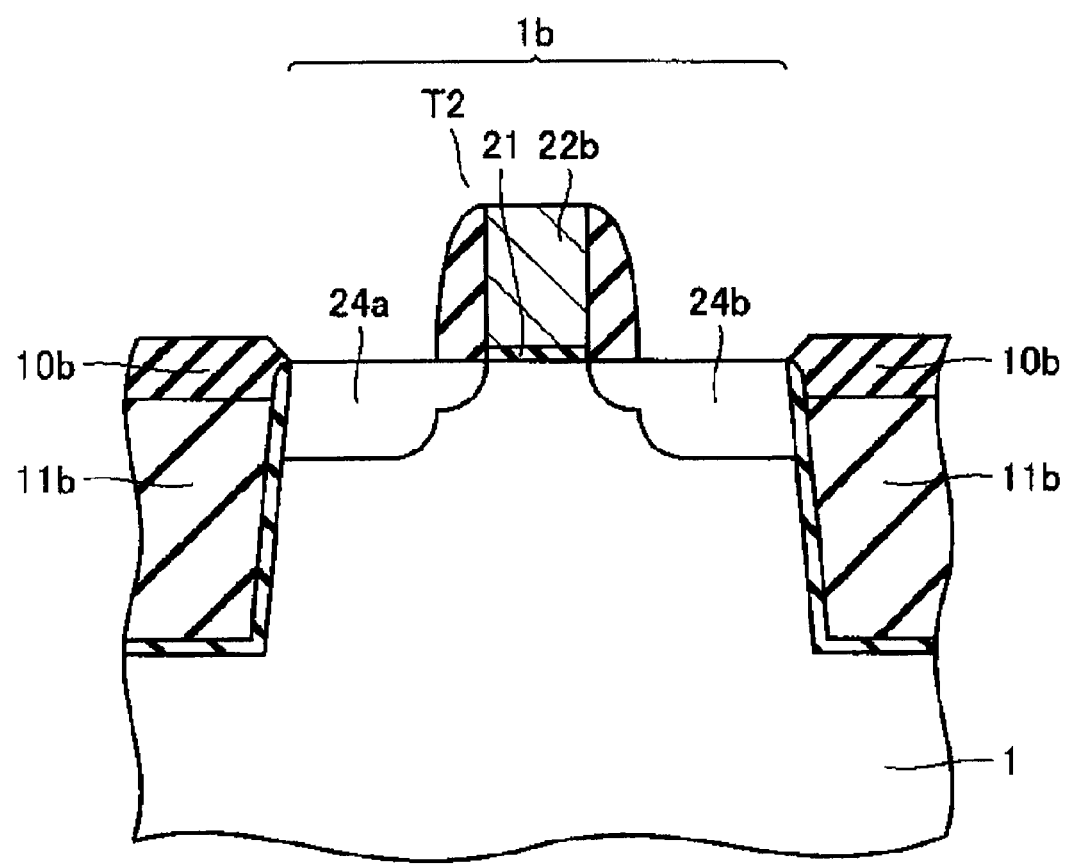
FIG. 28 is a cross-sectional view at a cross-sectional line XXVIII-XXVIII shown in FIG. 25 in the same Example.
Figure 29:
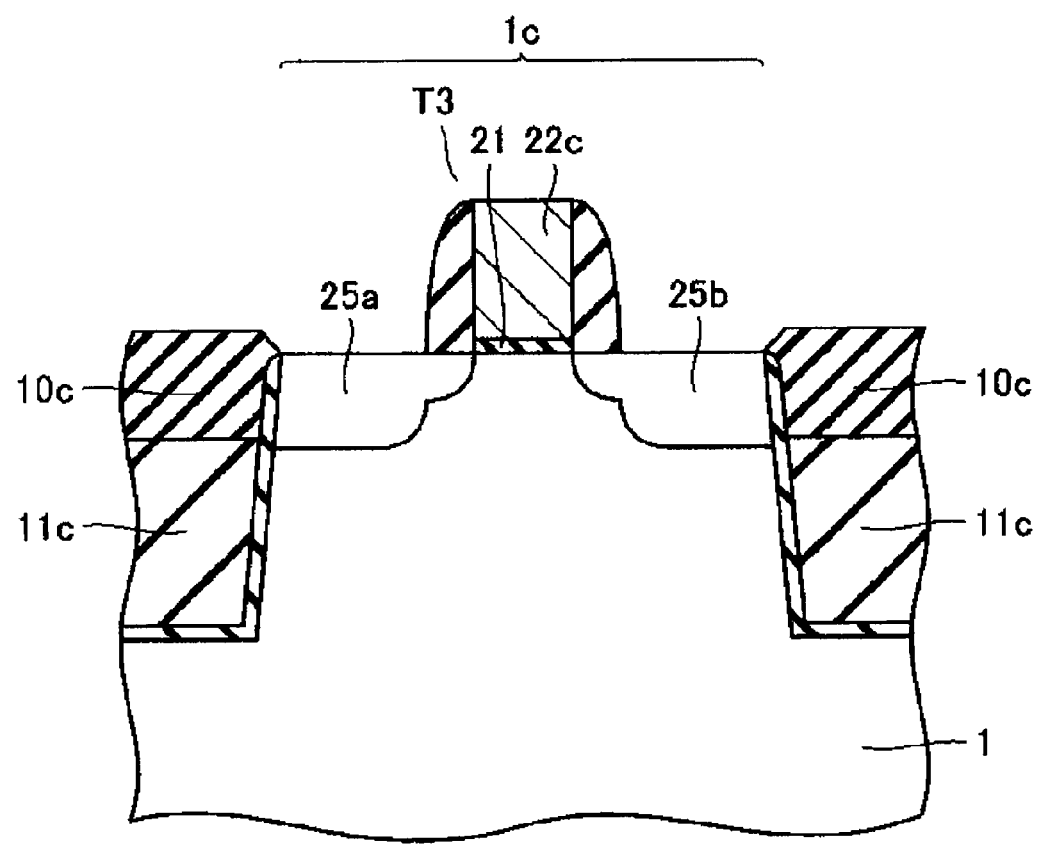
FIG. 29 is a cross-sectional view at a cross-sectional line XXIX-XXIX shown in FIG. 25 in the same Example.

Thus, as shown in FIG. 27, in the element formation region 1a, a MOS transistor T1 including source/drain regions 23a and 23b and the gate electrode 22a is formed. Also, as shown in FIG. 28, in the element formation region 1b, a MOS transistor T2 including source/drain regions 24a and 24b, and a gate electrode 22b is formed. Further, as shown in FIG. 29, in the element formation region 1c, a MOS transistor T3 including source/drain regions 25a and 25b, and a gate electrode 22c is formed. Meanwhile, in the cross-sectional views in FIGS. 27 to 29, a lamination structure in the shallow trench isolation is shown, while supposedly considering such a case that a shallow trench isolation having the same width as that in the direction of the cross-sectional line XXVI-XXVI is adjacently formed also in the direction of cross-sectional lines XXVII-XXVII, XXVIII-XXVIII and XXIX-XXIX shown in FIG. 25.

In the aforementioned semiconductor device, the silicon oxide film 11 by $O_3$-TEOS is formed as the silicon oxide film (the lower layer) formed in the gap for the shallow trench isolations 4, 5, and 6. In the case of the $O_3$-TEOS-based silicon oxide film 11, too, the silicon oxide film 11 formed over a shallow trench isolation having a narrower width has a higher wet etching rate, as is the case for the silicon oxide film 9 formed from a polysilazane film.

Consequently, the thickness of the silicon oxide film 11 left in the gap for the shallow trench isolation having a relatively narrow width becomes thinner than the thickness of the silicon oxide film 11 left in the gap for the shallow trench isolation having a relatively wide width. Then, the silicon oxide film 10 (the upper layer) by the HDP-CVD method with a comparatively high compressive stress is more thickly laminated over the silicon oxide film 11 in the lower layer by the thinned thickness of the silicon oxide film 11, and the compressive stress of the element isolation oxide film finally formed in the gap for the shallow trench isolation having a relatively narrower width is more raised.

This reduces the difference between the compressive stress of the isolation oxide film finally formed in the gap for the shallow trench isolation having a relatively narrow width and the compressive stress of the isolation oxide film finally formed in the gap for the shallow trench isolation having a relatively wide width, to reduce the variation of the compressive stress acting on the element formation regions 1a, 1b and 1c to which the shallow trench isolations 4, 5 and 6 having various widths are adjacent. As the result, it is possible to reduce the variation of electrical characteristics of MOS transistors T1, T2 and T3 formed in each of the element formation regions 1a, 1b and 1c.

Meanwhile, in the aforementioned respective Examples, the description was given while mentioning a case where a silicon oxide film from polysilazane film formed by the SOD method and an $O_3$-TEOS-based silicon oxide film as examples of the silicon oxide film (the lower layer) formed in the gap for the shallow trench isolation. A silicon oxide film to be embedded into the gap for the shallow trench isolation is not limited to these silicon oxide films, but any insulating film whose thickness is thinned in 5% or more by being subjected to an annealing treatment at a temperature of about 1100° C. can give an intended effect.

Moreover, in the description, a MOS transistor is exemplified as the semiconductor element to be formed in the element formation region, but the element is not limited to the MOS transistor only when it is a semiconductor element whose action is influenced by stress acting on the element formation region, and, by applying the element isolation structure provided with the aforementioned shallow trench isolation, the variation of electrical characteristics of the semiconductor element can be reduced.

Examples disclosed this time are for exemplification and the present invention is not limited to these. The present invention is shown not by the aforementioned range but by the claim, and intends to include all changes in the meaning and range equivalent to the claim.

The present semiconductor device is effectively utilized for semiconductor devices having a so-called STI structure.

What is claimed is:

1. A semiconductor device comprising:
   a first shallow trench isolation having a prescribed depth and a first width so as to surround a first region in the semiconductor substrate;
   a second shallow trench isolation having a prescribed depth and a second width narrower than the first width so as to surround a second region in the semiconductor substrate;
   a first element isolation insulating film embedded in the first shallow trench isolation; and
   a second element isolation insulating film embedded in the second shallow trench isolation, wherein:

the second element isolation insulating film includes: a first insulating film having a prescribed density; and a second insulating film having a density higher than the density of the first insulating film;

in the second shallow trench isolation, the first insulating film and the second insulating film are embedded so that the second insulating film is stacked over the first insulating film; and the first element isolation insulating film includes the first insulating film and does not include the second insulating film.

2. The semiconductor device according to claim 1, further comprising
a third shallow trench isolation having a prescribed depth and a third width narrower than the second width so as to surround a third region in the semiconductor substrate, wherein;
the second element isolation insulating film is embedded in the third shallow trench isolation;
in the third shallow trench isolation, the first insulating film and the second insulating film are embedded so that the second insulating film is stacked over the first insulating film; and
the second insulating film embedded in the third shallow trench isolation is formed thicker than the second insulating film embedded in the second shallow trench isolation.

3. The semiconductor device according to claim 1, wherein the wet etching rate of the second insulating film for a prescribed wet etching liquid is lower than that of the first insulating film for the wet etching liquid.

4. The semiconductor device according to claim 1, wherein the contraction percentage of the second insulating film by a prescribed heat treatment is smaller than that of the first insulating film by the heat treatment.

5. The semiconductor device according to claim 1, wherein the first insulating film is a silicon oxide film by coating or $O_3$-TEOS, and the second insulating film is a silicon oxide film by a high density plasma chemical vapor deposition method.

6. The semiconductor device according to claim 1, further comprising: a first transistor formed in the first region and including a first gate electrode; a second transistor formed in the second region and including a second gate electrode; and a third transistor formed in a third region and including a third gate electrode.

7. A semiconductor device comprising:
a first shallow trench isolation having a prescribed depth and a first width so as to surround a first region in the semiconductor substrate;
a second shallow trench isolation having a prescribed depth and a second width narrower than the first width so as to surround a second region in the semiconductor substrate;
a third shallow trench isolation having a prescribed depth and a third width narrower than the second width so as to surround a third region in the semiconductor substrate;
a first element isolation insulating film embedded in the first shallow trench isolation;
a second element isolation insulating film embedded in the second shallow trench isolation and the third shallow trench isolation, wherein:
the first element isolation insulating film includes the first insulating film;
the second element isolation insulating film includes: a first insulating film having a prescribed density; and a second insulating film having a density higher than the density of the first insulating film;
in the second shallow trench isolation, the first insulating film and the second insulating film are embedded so that the second insulating film is stacked over the first insulating film;
in the third shallow trench isolation, the first insulating film and the second insulating film are embedded so that the second insulating film is stacked over the first insulating film; and
the first insulating film embedded in the third shallow trench isolation is thinner than the first insulating film embedded in the second shallow trench isolation.

8. The semiconductor device according to claim 7, wherein the second insulating film embedded in the third shallow trench isolation is thicker than the second insulating film embedded in the third shallow trench isolation.

* * * * *